(12) United States Patent
Ohara

(10) Patent No.: US 11,665,945 B2
(45) Date of Patent: May 30, 2023

(54) SEMICONDUCTOR DEVICE

(71) Applicant: Japan Display Inc., Tokyo (JP)

(72) Inventor: Hiroki Ohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/406,614

(22) Filed: Aug. 19, 2021

(65) Prior Publication Data

US 2021/0384286 A1    Dec. 9, 2021

Related U.S. Application Data

(63) Continuation of application No. 16/714,949, filed on Dec. 16, 2019, now Pat. No. 11,121,204, which is a continuation of application No. PCT/JP2018/015426, filed on Apr. 12, 2018.

(30) Foreign Application Priority Data

Jul. 12, 2017    (JP) .............................. JP2017-136016

(51) Int. Cl.
*H10K 59/131*    (2023.01)
*H10K 77/10*    (2023.01)
*H10K 50/844*    (2023.01)

(52) U.S. Cl.
CPC ......... *H10K 59/131* (2023.02); *H10K 77/111* (2023.02); *H10K 59/1201* (2023.02)

(58) Field of Classification Search
CPC ............. H01L 27/3258; H01L 27/3276; H01L 51/5253; H01L 51/0097; H01L 2251/5338
See application file for complete search history.

(56) References Cited

U.S. PATENT DOCUMENTS

| 9,904,130 | B2 * | 2/2018 | Kubota | G02F 1/13452 |
| 10,644,256 | B2 * | 5/2020 | Kishimoto | H05B 33/10 |
| 2014/0232956 | A1 * | 8/2014 | Kwon | G02F 1/133305 |
| | | | | 349/12 |
| 2016/0035759 | A1 * | 2/2016 | Kwon | H01L 27/1225 |
| | | | | 438/151 |

(Continued)

FOREIGN PATENT DOCUMENTS

| CN | 107123667 A | * | 9/2017 | ......... H01L 27/3246 |
| WO | WO-2019150503 A1 | * | 8/2019 | ......... H01L 27/3258 |

*Primary Examiner* — Errol V Fernandes
*Assistant Examiner* — Jeremy J Joy
(74) *Attorney, Agent, or Firm* — Michael Best & Friedrich LLP

(57) ABSTRACT

Disclosed is a display device including: a substrate; a first insulating film over the substrate, the first insulating film exposing a part of the substrate to provide an exposed surface to the substrate; a second insulating film in contact with the exposed surface and a first side surface of the first insulating film; and a first wiring over the second insulating film and in contact with the exposed surface, the first insulating film, and the second insulating film. The display device may further possess a third insulating film spaced from the second insulating film and in contact with the exposed surface. The first insulating film has a second side surface opposing the first side surface through the exposed surface. The third insulating film may be in contact with the second side surface, and the wiring may be located over and in contact with the third insulating film.

10 Claims, 22 Drawing Sheets

(56) References Cited

U.S. PATENT DOCUMENTS

| | | | | |
|---|---|---|---|---|
| 2016/0174304 A1* | 6/2016 | Kim | ................... | H01L 51/5253 |
| | | | | 313/511 |
| 2016/0204183 A1* | 7/2016 | Tao | ...................... | H01L 25/167 |
| | | | | 438/34 |
| 2016/0233289 A1* | 8/2016 | Son | ...................... | H01L 27/326 |
| 2017/0097529 A1* | 4/2017 | Kubota | ................. | G02F 1/1345 |
| 2017/0179423 A1* | 6/2017 | Kwon | ................ | G02F 1/133305 |
| 2017/0237025 A1* | 8/2017 | Choi | ................... | H01L 51/0097 |
| | | | | 257/40 |
| 2017/0262109 A1* | 9/2017 | Choi | ................... | H01L 27/3258 |
| 2017/0294620 A1* | 10/2017 | Park | ................... | H01L 51/5284 |
| 2017/0309651 A1* | 10/2017 | Kim | ..................... | G02F 1/1345 |
| 2018/0013095 A1* | 1/2018 | Choi | ................... | H01L 51/0097 |
| 2018/0047802 A1* | 2/2018 | Yoon | ................... | H01L 27/3276 |
| 2018/0108723 A1* | 4/2018 | Nishimura | .......... | H01L 51/5253 |
| 2018/0269427 A1* | 9/2018 | Park | ................... | H01L 51/5246 |
| 2018/0314098 A1* | 11/2018 | Saitoh | ................. | G02F 1/1339 |
| 2020/0013851 A1* | 1/2020 | Kim | .................... | H01L 51/0097 |
| 2020/0066821 A1* | 2/2020 | Saitoh | ................... | H05B 33/10 |
| 2020/0194718 A1* | 6/2020 | Kishimoto | ............ | H05B 33/02 |
| 2020/0328234 A1* | 10/2020 | Zhang | .................. | G02F 1/1362 |
| 2021/0066440 A1* | 3/2021 | Okabe | ................ | H01L 27/3276 |
| 2021/0313412 A1* | 10/2021 | Okabe | ................... | H05B 33/02 |

* cited by examiner

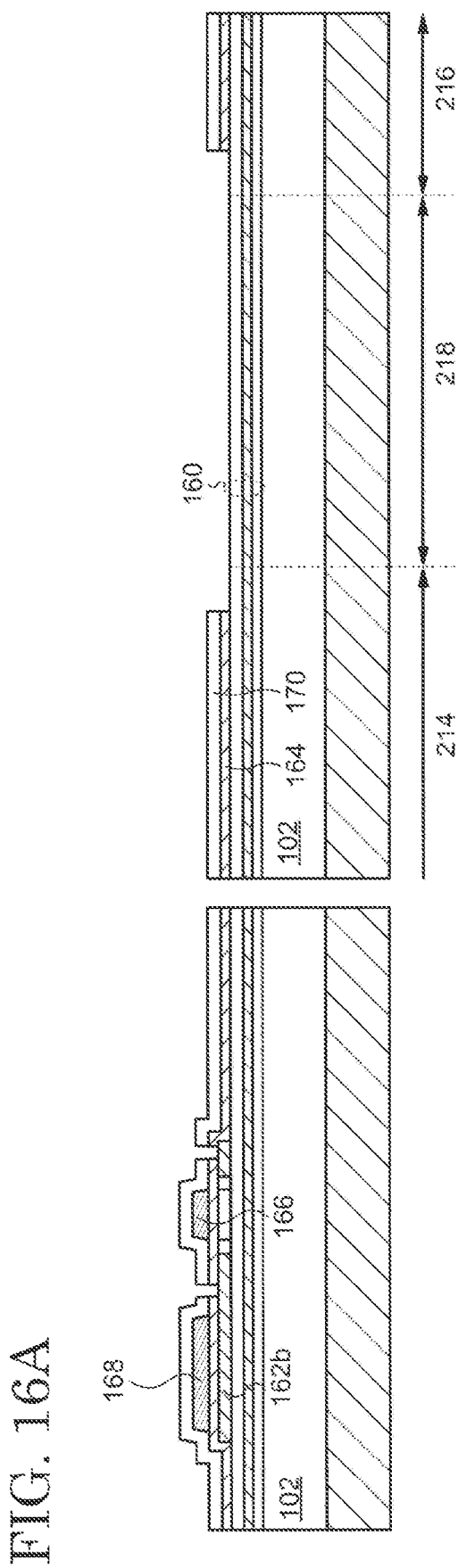

SEMICONDUCTOR DEVICE

CROSS REFERENCE TO RELATED APPLICATIONS

This application is a continuation of U.S. patent application Ser. No. 16/714,949, filed on Dec. 16, 2019, which, in turn, is based on and claims the benefit of priority from the prior Japanese Patent Application No. 2017-136016, filed on Jul. 12, 2017, and the PCT Application No. PCT/JP2018/015426, filed on Apr. 12, 2018, the entire contents of which are incorporated herein by reference.

FIELD

An embodiment of the present invention relates to a display device and a manufacturing method thereof. For example, an embodiment of the present invention relates to a display device having a light-emitting element and a manufacturing method thereof.

BACKGROUND

A liquid crystal display device and an organic EL (Electroluminescence) display device are represented as an example of display devices. These display devices possess a liquid crystal element or an organic light-emitting element (hereinafter, referred to as a light-emitting element) in each of a plurality of pixels formed over a substrate. A liquid crystal element and a light-emitting element respectively have a layer including a compound exhibiting liquid crystallinity and a layer (hereinafter referred to as an electroluminescence layer or an EL layer) including an emissive organic compound between a pair of electrodes (cathode and anode) and are driven by applying a voltage or supplying a current between the electrodes.

Use of a substrate with flexibility as a substrate provides flexibility to the whole of the display device, which enables production of a display device having a bent shape or a display device which can be freely deformed by a user. When a display device is bent, it is possible to reduce an apparent area of a frame and supply a display device with excellent designability by folding a substrate so that the portion (frame) which does not contribute to display overlaps with a display region (see Japanese Patent Application Publication No. 2012-128006).

SUMMARY

An embodiment of the present invention is a display device. The display device includes, a substrate; a first insulating film over the substrate, the first insulating film exposing a part of the substrate providing an exposed surface to the substrate, a second insulating film in contact with the exposed surface and a first side surface of the first insulating film; and a first wiring over the second insulating film and in contact with the exposed surface, the first insulating film, and the second insulating film.

An embodiment of the present invention is a display device. The display device includes, a substrate having a first region, a second region, and a trench overlapping with a region between the first region and second region and having a first sidewall and a second sidewall facing each other; a pair of first insulating films over the substrate and in contact with the substrate in the first region and the second region, respectively; a pair of second insulating films in the trench, the pair of second insulating films being spaced from each other and in contact with the first sidewall and the second sidewall, respectively; and a plurality of wrings over and in contact with the pair of first insulating films and the pair of second insulating films, the plurality of wirings being in contact with the substrate in the trench.

An embodiment of the present invention is a display device. The display device includes, a substrate having a first region, a second region, and a third region sandwiched by the first region and the second region, a pixel over the first region; a terminal over the second region; and an undercoat over the first region and the second region, the undercoat being arranged so that the substrate is exposed in the third region. The substrate possesses a first step between the first region and the third region, and a second step between the second region and the third region. The display device further includes: a first filler in contact with the first step; a second filler spaced from the first filler and in contact with the second step; and a plurality of wirings. The plurality of wirings is located over the undercoat and is in contact with the undercoat in the first region and the second region and with the first filler, the second filler, and the substrate in the third region.

An embodiment of the present invention is a manufacturing method of a display device. The manufacturing method includes: forming an undercoat over a substrate having a first region, a second region, and a third region between the first region and the second region; forming, in the first region, a transistor having a semiconductor film, a gate electrode, and a gate insulating film between the semiconductor film and the gate electrode; forming a first step between the first region and the third region and a second step between the second region and the third region by removing the undercoat in the second region to expose the substrate; forming a first filler in contact with a first sidewall of the first step and a second filler spaced from the first filler and in contact with a second sidewall of the second step; forming a source electrode and a drain electrode of the transistor in the first region; forming a terminal in the third region; and forming a plurality of wirings in contact with the undercoat in the first region and the second region and in contact with the first filler, the second filler, and the substrate in the third region.

BRIEF DESCRIPTION OF DRAWINGS

FIG. 16A is a schematic cross-sectional view for explaining a manufacturing method of a display device according to an embodiment;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings and a detailed explanation may be omitted as appropriate.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the present specification, when a plurality of structural elements similar to one another is discriminately indicated, the structural elements are expressed by using an underscore and a natural number after a reference number. When all of the structural elements are indicated or an arbitrarily selected multiple thereof is expressed indiscriminately, only a reference number is used.

In the present specification and claims, an expression "a structural body is exposed from another structural body" means an aspect where a portion of the structural body is not covered by the other structural body and includes an aspect where the portion which is not covered by the other structural body is covered by yet another structural body.

First Embodiment

A structure of a display device 100 according to an embodiment of the present invention is explained below.

1. Outline Structure

Figure 1:
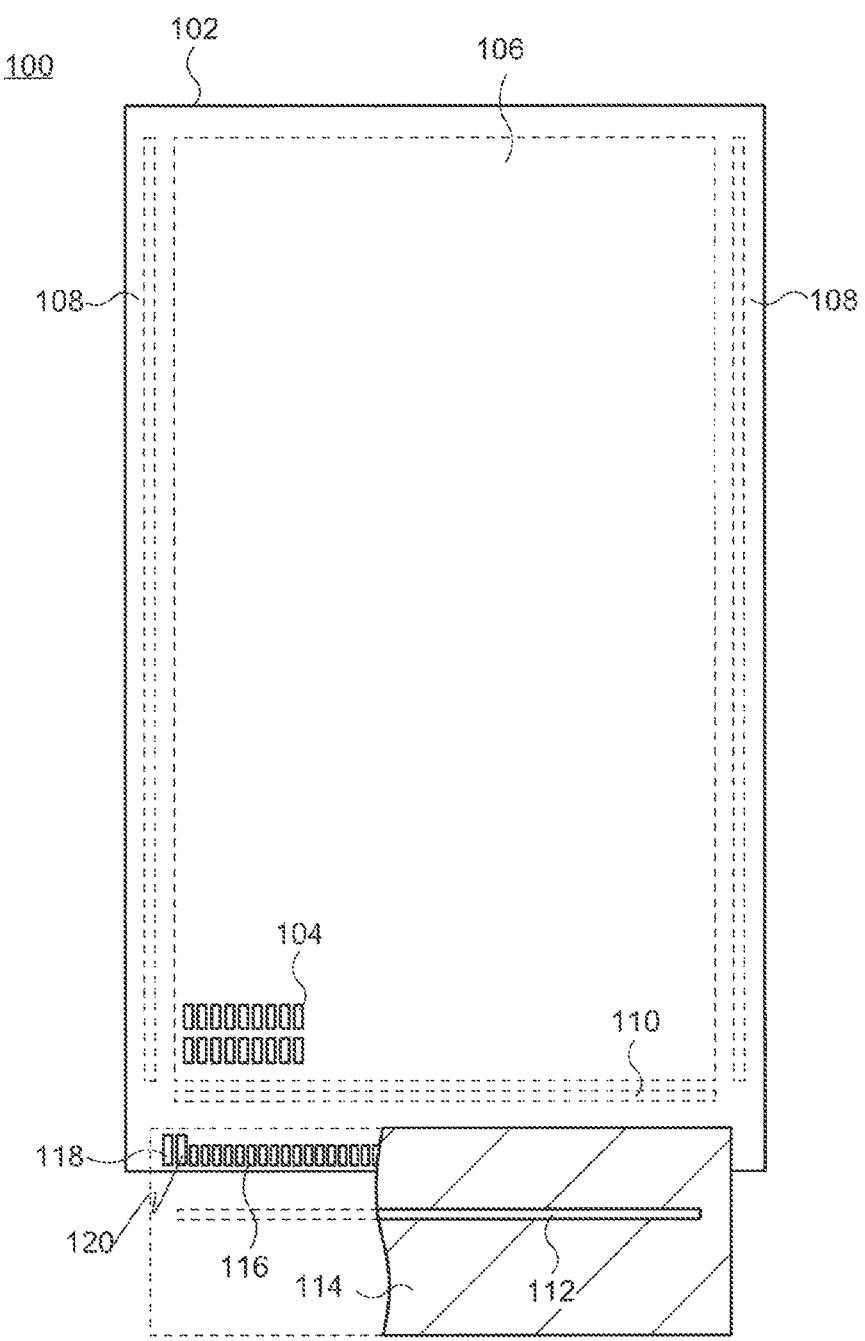
FIG. 1 is a schematic top view of a display device according to an embodiment.

A schematic top view of the display device 100 is shown in FIG. 1. The display device 100 possesses a substrate 102 and a variety of patterned insulating films, semiconductor films, and conductive films thereover. A plurality of pixels 104 and driver circuits (gate-side driver circuits 108 and source-side driver circuit 110) for driving the pixels 104 are formed by these insulating films, semiconductor films, and conductive films. The plurality of pixels 104 is periodically arranged and defines a display region 106. As described below, a display element is disposed in each pixel 104. Hereinafter, an example is explained in which a light-emitting element 130 is provided in the pixel 104 as a display element.

The gate-side driver circuits 108 and the source-side driver circuit 110 are arranged outside the display region 106 (peripheral region). A variety of wirings (not illustrated in FIG. 1) formed with patterned conductive films extends from the display region 106, the gate-side driver circuits 108, and the source-side driver circuit 110 to a side of the substrate 102 and is exposed at a vicinity of an edge portion of the substrate 102 to form terminals such as image-signal terminals 116 and power-source terminals 118 and 120. These terminals are electrically connected to a flexible printed circuit substrate (FPC) 114. In the example shown here, a driver IC 112 having an integrated circuit formed over a semiconductor substrate is mounted over the FPC 114. The function of the source-side driver circuit 110 may be integrated with the driver IC 112, and the driver IC 112 may not be mounted over the FPC 114 but may be mounted over the substrate 102. Image signals are supplied from an external circuit (not illustrated) through the driver IC 112 and FPC 114 and transmitted to the gate-side driver circuits 108 and the source-side driver circuit 110 through the image-signal terminals 116. A power source supplied to the light-emitting elements 130 in the pixels 104 is provided to the display device 100 through the FPC 114 and the power-source terminals 118 and 120. A high potential (PVDD) is provided to the power-source terminals 120, while a potential (PVSS) lower than the PVDD is provided to the power-source terminals 118. Signals based on these image signals and potentials are supplied to each pixel 104 with the wirings 220 electrically connected to the terminals, by which the pixels 104 are controlled and operated.

Use of a substrate having flexibility as the substrate 102 provides the display device 100 with flexibility. For example, folding the substrate 102 between the terminals and the display region 106 so that the FPC 114 and the terminals connected thereto overlap with the display region 106 allows the formation of a three-dimensional structure as shown in a side view of FIG. 2. At that time, a spacer 122 may be disposed to stabilize the folded structure. At least a part of an outer circumference of the spacer 122 is covered by the substrate 102.

2. Structure of Pixel
2-1. Pixel Circuit

In each pixel 104, a pixel circuit including the light-emitting element 130 is structured with a variety of patterned insulating films, semiconductor films, and conductive films. The structure of the pixel circuit can be arbitrarily selected, and an example thereof is demonstrated in FIG. 3 as an equivalent circuit.

Figure 3:
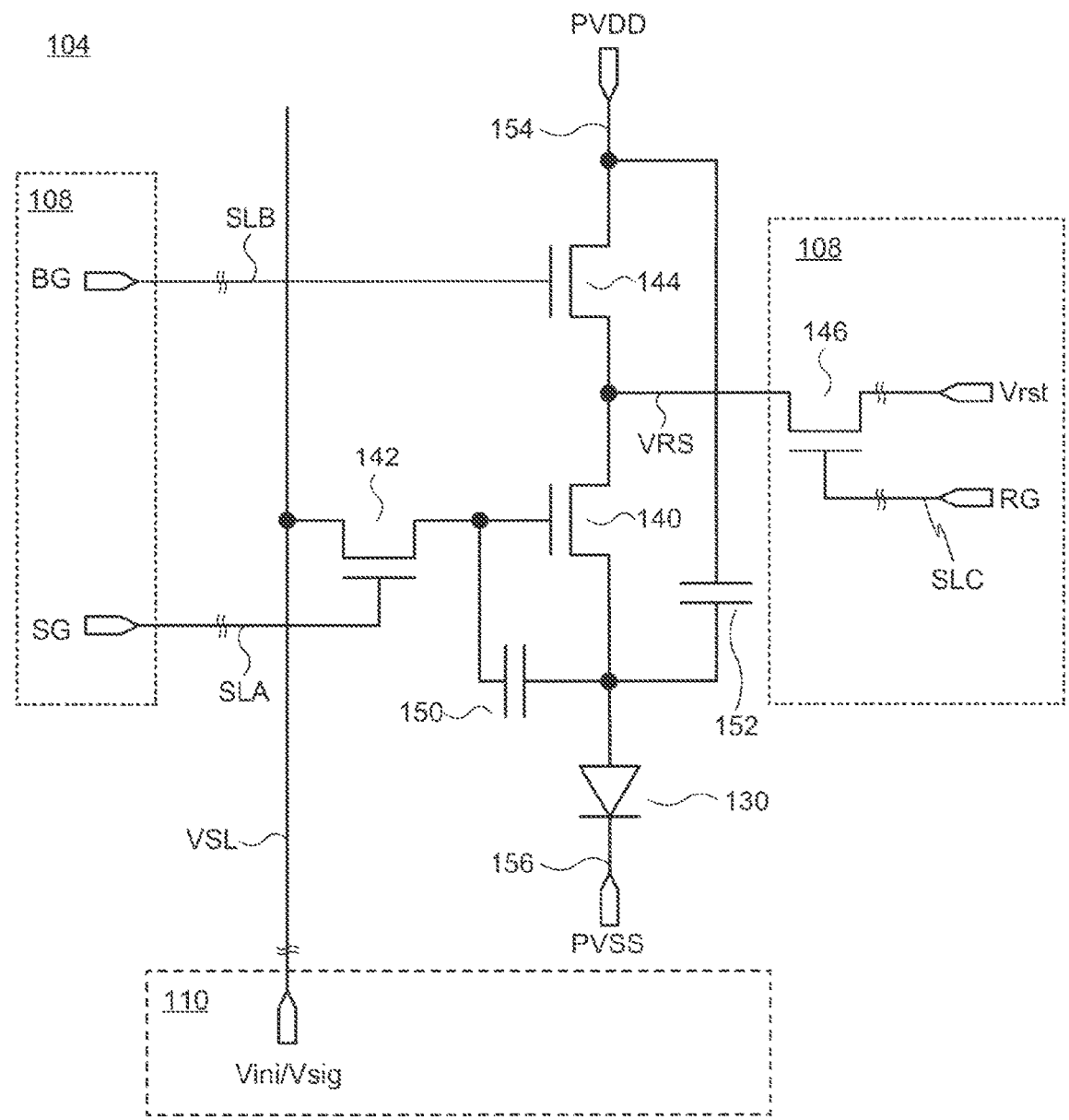
FIG. 3 is an example of an equivalent circuit of a pixel of a display device according to an embodiment.

The pixel circuit shown in FIG. 3 includes a driving transistor 140, a first switching transistor 142, a second switching transistor 144, a storage capacitor 150, and a supplementary capacitor 152 in addition to the light-emitting element 130. The light-emitting element 130, the driving transistor 140, and the second switching transistor 144 are connected in series between a high-potential power-source line 154 and a low-potential power-source line 156. The PVDD and PVSS are respectively supplied to the high-potential power-source line 154 and the low-potential power-source line 156.

In the present embodiment, the driving transistor 140 is assumed to be an n-channel type, and input-output terminals on a side of the high-potential power-source line 154 and a side of the light-emitting element 130 are defined as a drain and a source, respectively. The drain of the driving transistor 140 is electrically connected to the high-potential power-source line 154 through the second switching transistor 144, and the source thereof is electrically connected to a pixel electrode 184 of the light-emitting element 130.

A gate of the driving transistor 140 is electrically connected to a first signal line VSL through the first switching transistor 142. Operation (on/off) of the first switching transistor 142 is controlled with a scanning signal SG supplied to a first scanning signal line SLA connected to a gate thereof. When the first switching transistor 142 is on, a potential of the first signal line VSL is provided to the gate of the driving transistor 140. An initialization signal Vini and an image signal Vsig are provided to the first signal line VSL at a predetermined timing. The initialization signal Vini is a signal providing an initialization potential with a constant level. The on/off of the first switching transistor 142 is controlled at a predetermined timing while synchronizing with the first signal line VSL, and a potential based on the initialization signal Vini or the image signal Vsig is provided to the gate of the driving transistor 140.

A second signal line VRS is electrically connected to the drain of the driving transistor 140. A reset potential Vrst is supplied to the second signal line VRS through a third switching transistor 146. A timing at which the reset signal Vrst is applied through the third switching transistor 146 is controlled by a reset signal RG provided to a third signal line SLC.

The storage capacitor 150 is disposed between the source and drain of the driving transistor 140. One terminal of the supplementary capacitor 152 is connected to the source of the driving transistor 140, and the other terminal is connected to the high-potential power-source line 154. The supplementary capacitor 152 may be formed so that the ether terminal is connected to the low-potential power-source line 156. The storage capacitor 150 and the supplementary capacitor 152 are provided to maintain a source-drain voltage Vgs corresponding to the image signal Vsig when the image signal Vsig is provided to the gate of the driving transistor 140.

The source-side driver circuit 110 outputs the initialization signal Vini or the image signal Vsig to the first signal line VSL. The gate-side driver circuits 108 output the scanning signal SG, a scanning signal BG, and the reset signal RG to the first scanning line SLA, a second scanning line SLB, and the third signal line SLC.

Although it is necessary to dispose the driving transistor 140 and the first switching transistor 142 in each pixel 104 shown in FIG. 1, the second switching transistor 144 may be shared by the plurality of pixels 104 close to one another. Specifically, the second switching transistor 144 may be shared by the plurality of pixels 104 which belong to the same scanning line and which are close to one another. Additionally, although the third switching transistor 146 is arranged in the gate-side driver circuits 108 in the example shown in FIG. 3, the third switching transistor 146 may be formed in each pixel circuit or may be shared by the plurality of pixels 104 close to one another similar to the second switching transistor 144.

2-2. Cross-Sectional Structure

Figure 4:
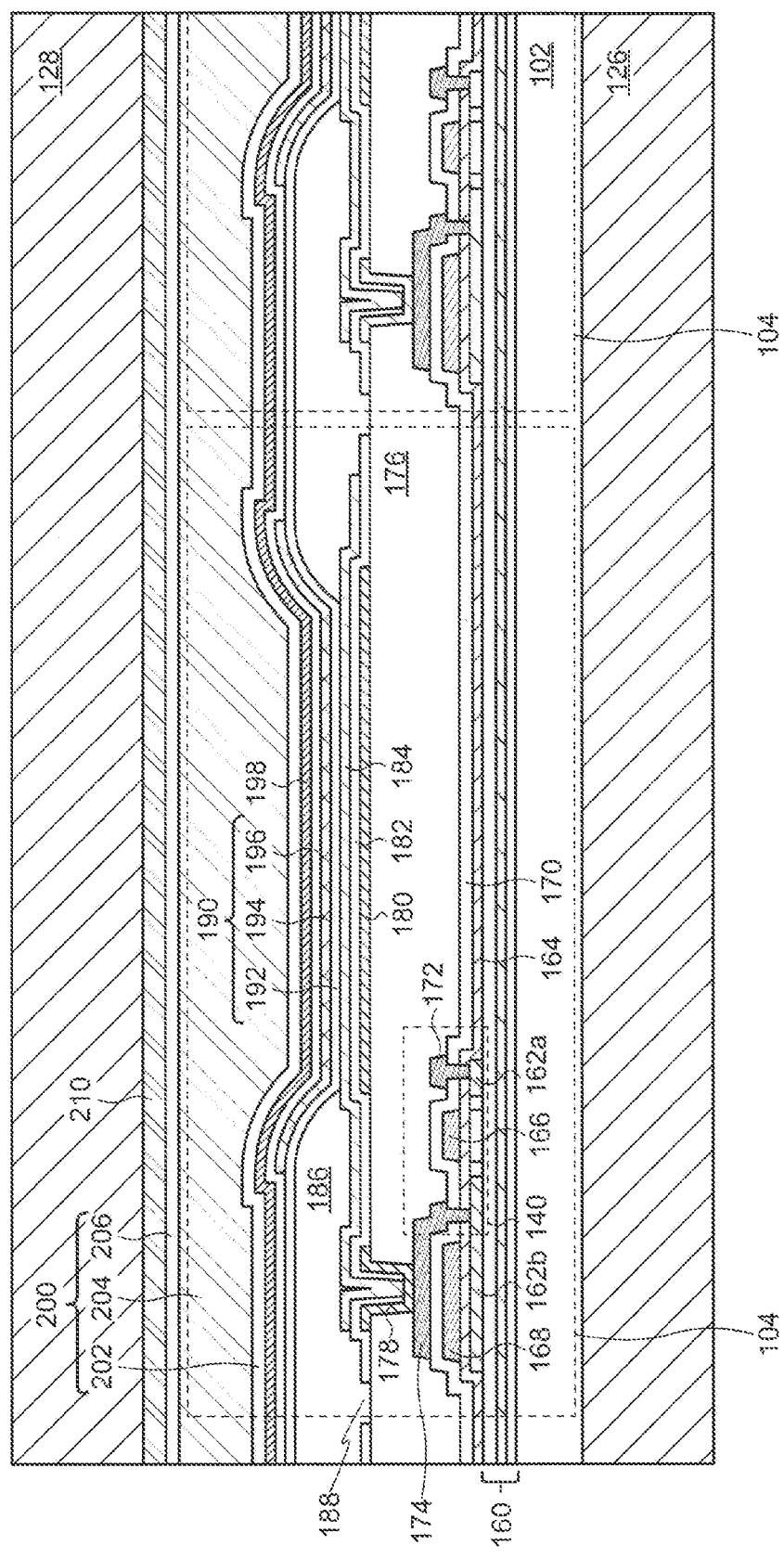
FIG. 4 is a schematic cross-sectional view of a display device according to an embodiment.

A cross-sectional structure of the pixel 104 is explained using the drawings. Cross-sectional structures of the driving transistor 140, the storage capacitor 150, the supplementary capacitor 152, and the light-emitting element 130 of the pixel circuits of the adjacent two pixels 104 formed over the substrate 102 are illustrated in FIG. 4.

Each element included in the pixel circuit is disposed over the substrate 102 through an undercoat 160. The driving transistor 140 includes a semiconductor film 162, a gate insulating film 164, a gate electrode 166, a drain electrode 172, and a source electrode 174. The gate electrode 166 is arranged to intersect at least a part of the semiconductor film 162 via the gate insulating film 164, and a channel is formed in a region where the gate electrode 166 overlaps with the semiconductor film 162. The semiconductor film 162 further possesses a drain region 162$a$ and a source region 162$b$ sandwiching the channel.

A capacitor electrode 168 existing in the same layer as the gate electrode 166 is formed to overlap with the source region 162$b$ through the gate insulating film 164. An interlayer insulating film 170 is disposed over the gate electrode 166 and the capacitor electrode 168. Openings reaching the drain region 162$a$ and the source region 162$b$ are formed in the interlayer insulating film 170 and the gate insulating film 164, and the drain electrode 172 and the source electrode 174 are arranged so as to cover the openings. A part of the source electrode 174 overlaps with a part of the source region 162b and the capacitor electrode 168 through the interlayer insulating film 170, and the storage capacitor 150 is structured by the part of the source region 162b, the gate insulating film 164, the capacitor electrode 168, the interlayer insulating film 170, and the part of the source electrode 174.

A planarization film 176 is further provided over the driving transistor 140 and the storage capacitor 150. The planarization film 176 has an opening reaching the source electrode 174, and a connection electrode 178 covering this opening and a part of a top surface of the planarization film 176 is formed to be in contact with the source electrode 174. The supplementary capacitor electrode 180 is further disposed over the planarization film 176. The connection electrode 178 and the supplementary capacitor electrode 180 may be simultaneously formed and can exist in the same layer. A capacitor insulating film 182 is formed to cover the connection electrode 178 and the supplementary capacitor electrode 180. The capacitor insulating film 182 does not cover a part of the connection electrode 178 in the opening of the planarization film 176 to expose a top surface of the connection electrode 178. This structure enables electrical connection between the pixel electrode 184 formed over the connection electrode 178 and the source electrode 174 via the connection electrode 178. An opening 188 may be formed in the capacitor insulating film 182 to allow contact of a partition wall 186 formed thereover with the planarization film 176. Impurities in the planarization film 176 can be removed through the opening 188, thereby improving reliability of the light-emitting element 130. Note that the formation of the connection electrode 178 and the opening 188 is optional.

The pixel electrode 184 is disposed over the capacitor insulating film 182 to cover the connection electrode 178 and the supplementary capacitor electrode 180. The capacitor insulating film 182 is sandwiched by the supplementary capacitor electrode 180 and the pixel electrode 184, and the supplementary capacitor 152 is configured by this structure. The pixel electrode 184 is shared by the supplementary capacitor 152 and the light-emitting element 130.

The partition wall 186 is provided over the pixel electrode 184 to cover an edge portion of the pixel electrode 184. An EL layer 190 and an opposing electrode 198 thereover are arranged so as to cover the pixel electrode 184 and the partition wall 186.

The EL layer 190 may be composed of a plurality of layers and is formed by combining a variety of functional layers such as a carrier-injection layer, a carrier-transporting layer, an emission layer, a carrier-blocking layer, and an exciton-blocking layer. The structure of the EL layer 190 may be the same in all of the pixels 104, or the EL layer 190 may be formed so that a part of the structure is different between the adjacent pixels 104. In FIG. 4, a hole-transporting layer 192, an emission layer 194, and an electron-transporting layer 196 are illustrated as the typical functional layers.

A protection film (hereinafter, referred to as a passivation film) 200 is arranged over the light-emitting elements 130 to protect the light-emitting elements 130. The structure of the passivation film 200 can be arbitrarily selected, and a stacked structure including a first layer 202 containing an inorganic compound, a second layer 204 containing an organic compound, and a third layer 206 containing an inorganic compound may be applied as shown in FIG. 4.

A film 210 (hereinafter, referred to as a resin film) including a resin is disposed over the passivation film 200.

The display device 100 further possesses supporting films 126 and 128 sandwiching the structure from the substrate 102 to the resin film 210, and appropriate physical strength is provided by the supporting films 126 and 128. The supporting films 126 and 128 are respectively fixed to the substrate 102 and the resin film 210 with an adhesive layer which is not illustrated.

As described below in detail, the undercoat 160, the gate insulating film 164, the interlayer insulating film 170, the capacitor insulating film 182, the first layer 202, and the third layer 206 are each an insulating film and include a film including a silicon-containing inorganic compound such as silicon nitride, silicon oxide, silicon nitride oxide, and silicon oxynitride. The films including a silicon-containing inorganic compound may be stacked in each insulating film. Therefore, these insulating films each include an inorganic compound containing silicon as a main structural element.

3. Terminals and Wirings

Figure 5:
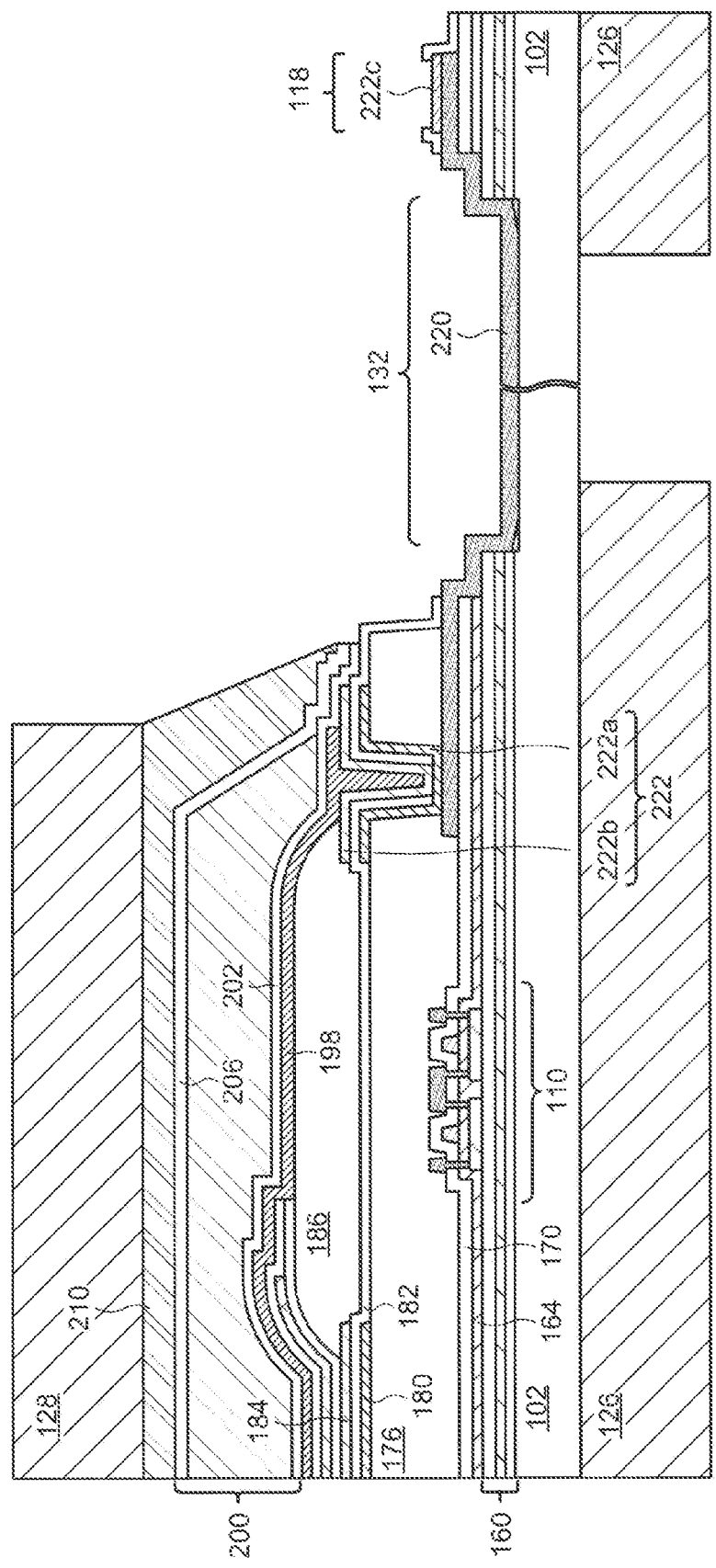
FIG. 5 is a schematic cross-sectional view of a display device according to an embodiment.

FIG. 5 schematically shows an example of a cross-sectional structure in which the region from an edge portion of the display region 106 (lower portion of the display region 106 in FIG. 1) to the power-source terminals 118 and 120 and the image-signal terminals 116 is at the center. Here, the cross-sections of a part of the display region 106, the source-side driver circuit 110, the power-source terminal 118, and the wiring 220 electrically connecting the display region 106 to the power-source terminal 118 are illustrated.

Figure 2:
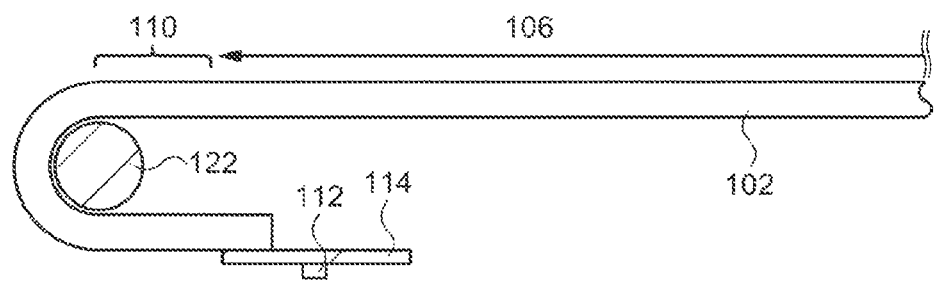
FIG. 2 is a schematic side view of a display device according to an embodiment.

As shown in FIG. 5, the supporting film 128 is divided into two portions by removing a part thereof, and a lower surface of the substrate 102 is exposed between the divided portions. The part where the supporting film 126 is removed has high flexibility, and the display device 100 can be folded by utilizing this part as shown in FIG. 2.

Semiconductor elements such as a transistor are provided in the source-side driver circuit 110, and a variety of circuits such as an analogue circuit are structured by the semiconductor elements. The opposing electrode 198 extends from the display region 106 to the edge portion of the substrate 102 and is electrically connected to the wiring 220 in an opening formed in the planarization film 176. More specifically, the wiring 220 is formed so as to be located between the interlayer insulating film 170 and the planarization film 176, that is, to exist in the same layer as the source electrode 174 and the drain electrode 172 in the pixel 104. The planarization film 176 has the opening reaching the wiring 220 between the source-side driver circuit 110 and the power-source terminal 118, and a contact electrode 222 including a first contact electrode 222a and a second contact electrode 222b over the first contact electrode 222a are disposed so as to cover this opening. The opposing electrode 198 is electrically connected to the wiring 220 through the second contact electrode 222b and the first contact electrode 222a. The wiring 220 forms the power-source terminal 118 at the vicinity of the edge portion of the substrate 102. A surface of the power-source terminal 118 is covered with a protection electrode 222c existing in the same layer as the first contact electrode 222a.

4. Filler

Figure 6:
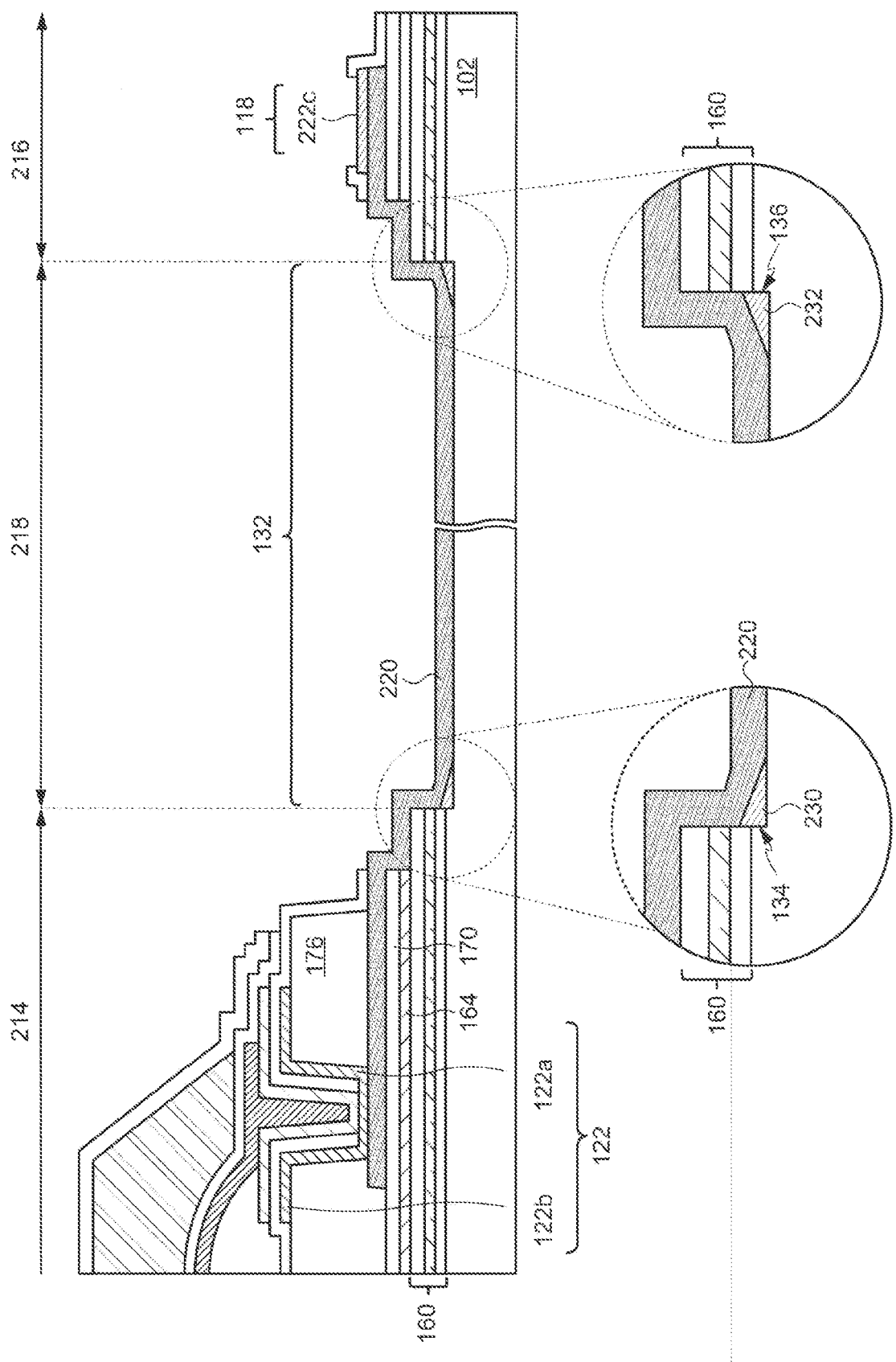
FIG. 6 is a schematic cross-sectional view of a display device according to an embodiment.

An enlarged view of FIG. 5 in which the wiring 220 is at the center is shown in FIG. 6. As shown in FIG. 6, the undercoat 160 is partly removed to be divided into two portions, providing the substrate 102 with an exposed surface exposed from the undercoat. Here, the region in which the substrate 102 is exposed from the undercoat 160 is referred to as a third region 218, and the regions in which the undercoat 160 exist are referred to as a first region 214 and a second region 216. The display region 106, the source-side driver circuit 110, and the contact electrode 222 are located in the first region 214, while the variety of terminals including the power-source terminal 118 is located in the second region 216.

A thickness of the substrate 102 in the third region 218 is smaller than that in other regions. That is, a trench 132 overlapping with a region between the first region 214 and the second region 214, i.e., the third region 218, is formed in the substrate 102. Although the undercoat 160, the gate insulating film 164, the interlayer insulating film 170, and the planarization film 176 are arranged over the substrate 102, these insulating films are removed in the trench 132. Namely, these insulating films are not disposed in the third region 218. Side surfaces of the gate insulating film 164 and the interlayer insulating film 170 may overlap with a top surface of the undercoat 160 as shown in FIG. 6 or exist in the same plane as the side surfaces of the undercoat 160.

The trench 132 is structured by the sidewalls (first sidewall 134 and second sidewall 136) opposing each other and the top surface of the substrate 102 between the first sidewall 134 and the second Sidewall 136. A step (first step) s formed by the first sidewall 134 between the first region 214 and the third region 218, and a step (second step) is formed by the second sidewall 136 between the second region 216 and the third region 218. These sidewalls may be located in the same plane as the side surfaces of the undercoat 160 or do not have to be in alignment with the side surfaces of the undercoat 160.

The display device 100 further possesses a pair of fillers (first filler 230 and second filler 232) in the trench 132. The fillers are insulating films including a polymer such as an epoxy resin and an acrylic resin. Therefore, the fillers are organic compounds and contain carbon, oxygen, and hydrogen as main structural elements. The first filler 230 is in contact with the first step. That is, the first filler 230 is in contact with the substrate 102 and the first sidewall 134 in the trench 132. The second filler 232 is in contact with the second step. That is, the second filler 232 is spaced from the first filler 230 and in contact with the substrate 102 and the second sidewall 136 in the trench 132. The first filler 230 and the second filler 232 may be in contact with or spaced from the side surfaces of the undercoat 160. It is preferred to form the first filler 230 and the second filler 232 so as not to be in contact with the top surface of the undercoat 160.

The wiring 220 is formed over the first filler 230 and the second filler 232 in the trench 132 and in contact with the first filler 230, the second filler 232, and the substrate 102. The wiring 220 is not in contact with the first sidewall 134 and the second sidewall 136 due to the first filler 230 and the second filler 232. The wiring 220 is further in contact with the side surface of the undercoat 160. When the side surfaces of the gate insulating film 164 and the interlayer insulating film 170 overlap with the top surface of the undercoat 160, the wiring 220 is in contact with the top surface of the undercoat 160, the side surface of the gate insulating film 164, and the side surface of the interlayer insulating film 170 between the first sidewall 134 and the display region 106 and between the second sidewall 136 and the power-source terminal 118.

Figure 7A:
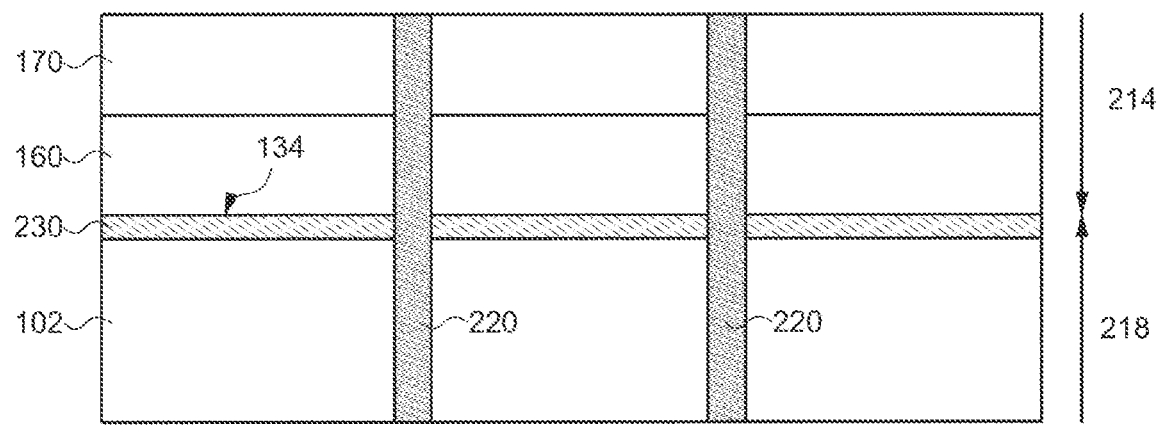
FIG. 7A is a schematic top view of a display device according to an embodiment.
Figure 7B:
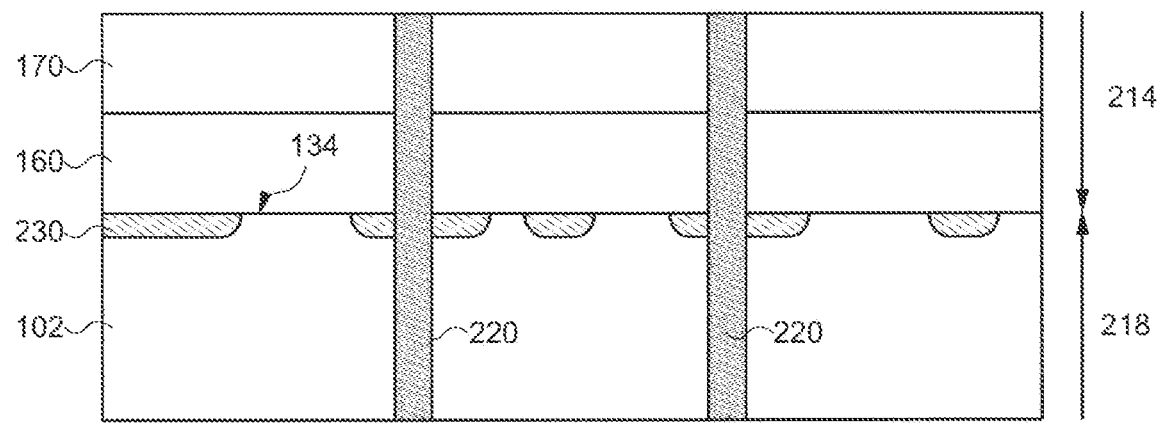
FIG. 7B is a schematic top view of a display device according to an embodiment.
Figure 7C:
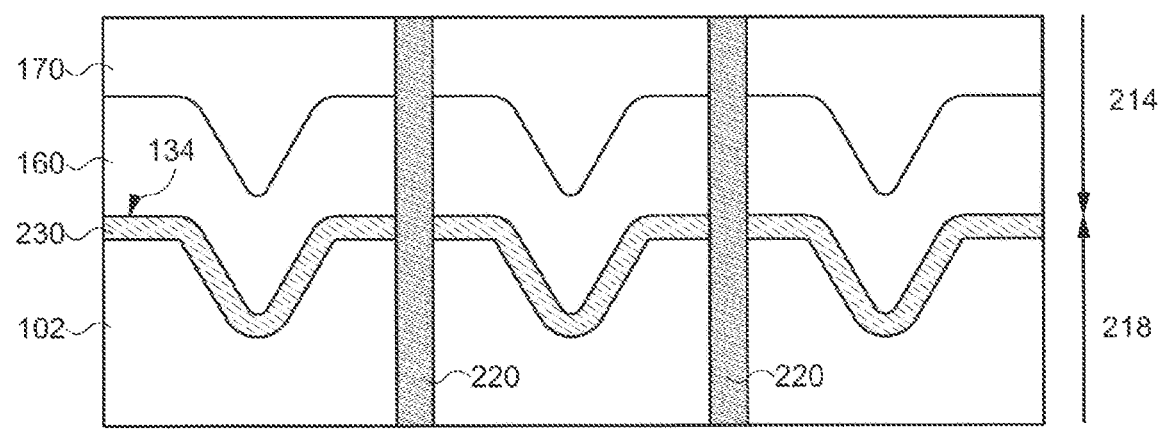
FIG. 7C is a schematic top view of a display device according to an embodiment.

A schematic top view of a boundary between the first region 214 and the third region 218 and the vicinity thereof is shown in FIG. 7A to FIG. 7C. Here, a layout of the undercoat 160, the first filler 230, the interlayer insulating film 170, and the wirings 220 is illustrated. As demonstrated in FIG. 7A, the first filler 230 may be arranged in a stripe form along the first sidewall 134 (that is, along the side surface of the undercoat 160). In this case, the first filler 230 may be continuous between the long sides of the substrate 102 opposing each other or may be partly divided. Alternatively, as shown in FIG. 7B, the first filler 220 may be formed in an island form so as to be distributed along the first sidewall 134. In this case, it is preferred that at least the first filler 230 located under the wiring 220 be continuous across the entire width of the wiring 220. Although not illustrated, the same is applied to the second filler 232.

In the examples shown in FIG. 7A and FIG. 7B, the first sidewall 134, the side surface of the undercoat 160, and the side surface of the interlayer insulating film 170 are formed to be parallel to the short side of the substrate 102. However, these sidewall and side surfaces may have a curve in a plane parallel to the top surface of the substrate 102. That is, these sidewall and side surfaces may have a curved shape in a plane view. For example, as shown in FIG. 7C, the first sidewall 134, the side surface of the undercoat 160, and the side surface of the interlayer insulating film 170 each may have a curved shape between adjacent wirings 220 and provide a straight line in a region overlapping with the wiring 220 in the plane parallel to the top surface of the substrate 102. In this case, the first filler 230 and the second filler 232 also have a curved shape in the plane parallel to the top surface of the substrate 102. The formation of such shapes enables reduction of a probability of a short circuit between the wirings 220 even though an etching residue of the wirings 220 is attached to the first sidewall 134, the side surface of the undercoat 160, or the side surface of the interlayer Insulating film 170 because the distances between the adjacent wirings 220 along the first sidewall 134, the side surface of the undercoat 160, and the side surface of the interlayer insulating film 170 are increased.

Figure 8:
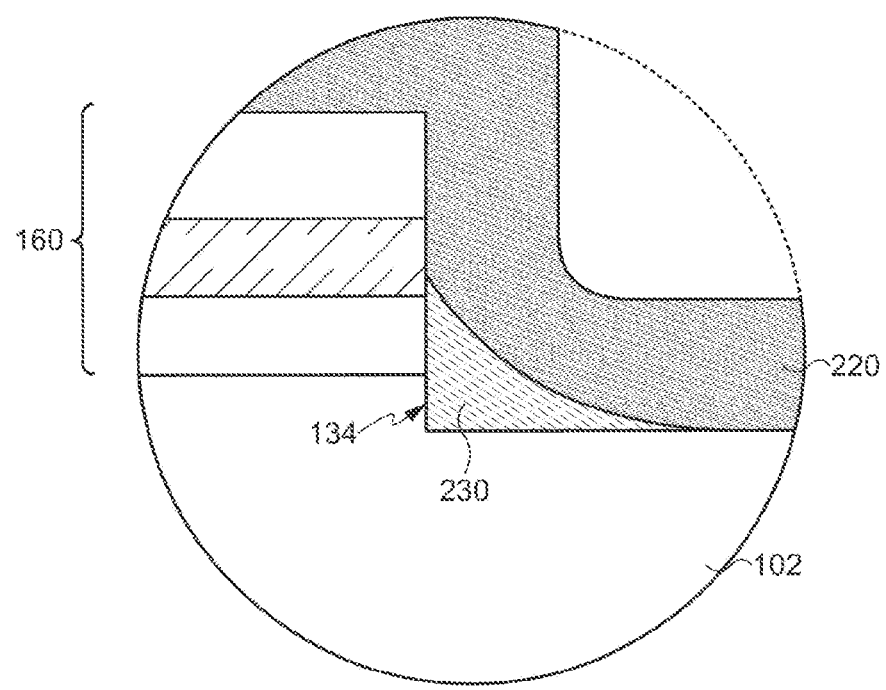
FIG. 8 is a schematic cross-sectional view of a display device according to an embodiment.
Figure 9A:
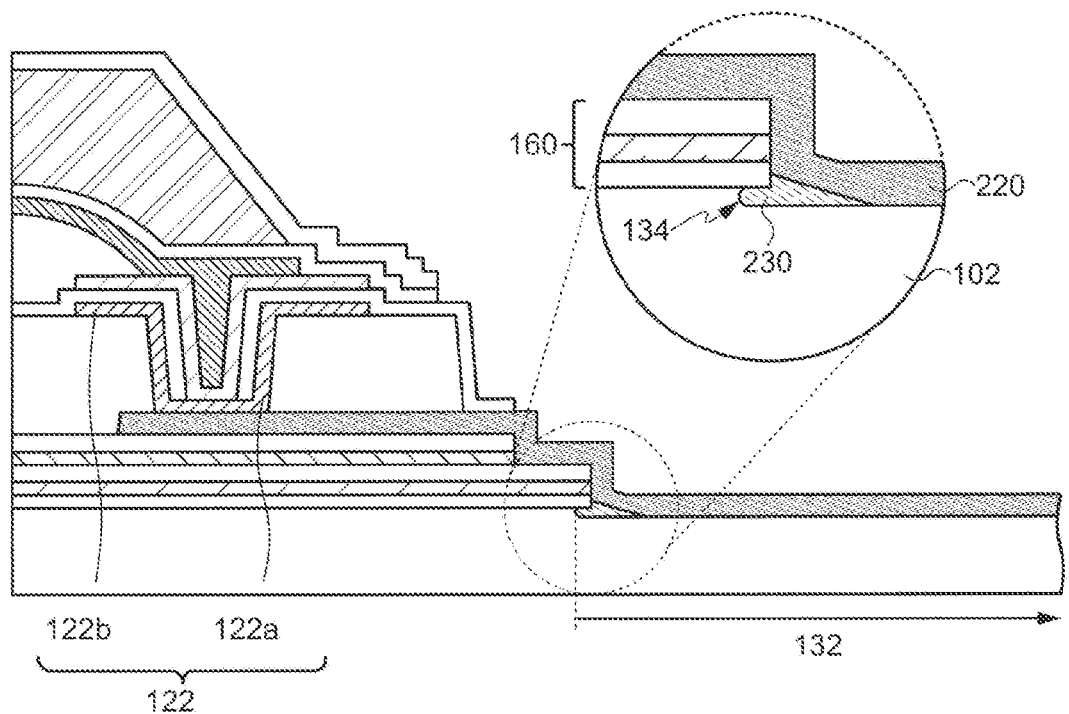
FIG. 9A is a schematic cross-sectional view of a display device according to an embodiment.
Figure 9B:
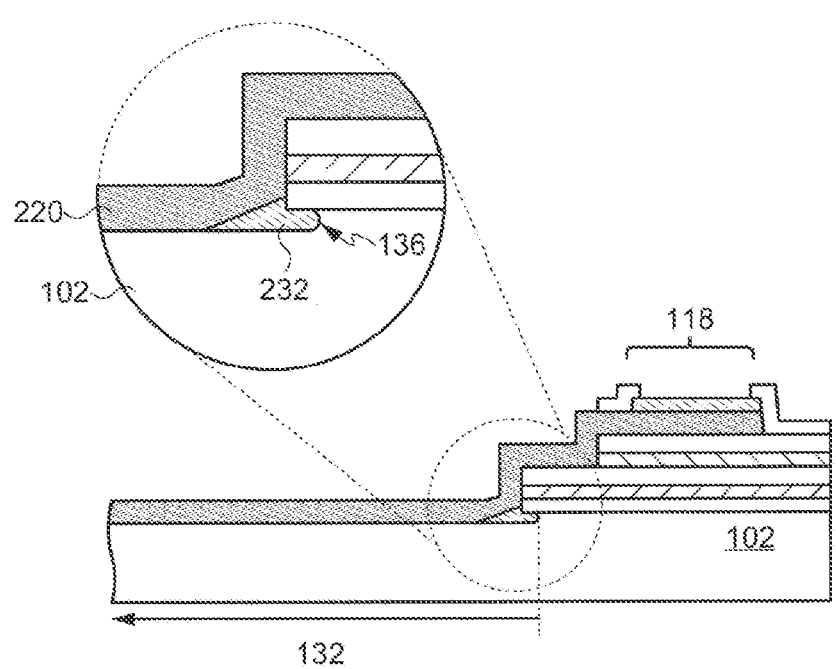
FIG. 9B is a schematic cross-sectional view of a display device according to an embodiment.

The surfaces on which the first filler 230 and the second filler 232 are in contact with the wiring 220 are inclined from the first sidewall 134, the second sidewall 136, or the top surface of the substrate 102 as shown in FIG. 6. These surfaces may be a plane surface or a curved surface as shown in FIG. 8. Furthermore, as shown in FIG. 9A and FIG. 9B, the first sidewall 134 and the second sidewall 136 may enter under the undercoat 160. That is, a structure (overhang structure) in which the side surface of the undercoat 160 overlaps with the trench 132 may be formed by side-etching the substrate 102. In this case, the first filler 230 and the second filler 232 are formed so as to fill a gap between the top surface of the substrate 102 and the undercoat 160 and to partly overlap with the undercoat 160. The first sidewall 134 and the second sidewall 136 may have a curved shape in a cross-section perpendicular to the top surface of the substrate 102.

As described above, the third region 218 in which the undercoat 160, the gate insulating film 164, and the interlayer insulating film 170 are removed is provided between the display region 106 and the terminals (power-source terminals 118 and 120 and the image-signal terminals 116) of the display device 100. In addition, the trench 132 overlapping with the third region 218 is formed in the substrate 102. Therefore, the third region 218 is more flexible than other regions, and the display device 100 can be readily folded in this region.

However, in the case where these insulating films are removed and the trench 132 is formed, the wirings 220 are readily disconnected due to their steps because relatively large steps are generated from the display region 106 to the terminals. Particularly, when the display device 100 is folded by utilizing the third region 218, disconnection of the wirings 220 is promoted because a large stress is applied to the wirings 220 at the vicinity of these steps. For example, a large stress is applied to the wirings 220 over the first sidewall 134 and the second sidewall 136, and therefore, the disconnection readily occurs. Such disconnection frequently occurs particularly at the portion where the undercoat 160 has the aforementioned overhang structure at the terminal portion of the trench 132.

In contrast, the display device 100 described in the present embodiment possesses the fillers in contact with the first sidewall 134, the second sidewall 136, and the substrate 102 in the trench 132. The fillers are capable of particularly reducing the steps caused by the first sidewall 134 and the second sidewall 136 and decreasing the variation in a cross-sectional shape which occurs from the undercoat 160 to the trench 132. Hence, the stress applied to the wirings 220 when folding the display device 100 is decreased, and the disconnection can be suppressed.

Moreover, in the case where the display device 100 has the overhang structure, an etching residue tends to be left in the gap between the top surface of the substrate 102 and the undercoat 160 when the wirings 220 are formed with etching, which may cause a short circuit between the wirings. However, the gap is filled with the filler, which prevents the short circuit between the wirings. Therefore, implementation of the present embodiment provides high reliability to the display device 100.

Second Embodiment

In the First Embodiment, an explanation is made for the display device 100 in which the steps generated by the sidewalls (first sidewall 134 and the second sidewall 136) of the trench 132 formed in the substrate 102 and the side surface of the undercoat 160 are decreased by the fillers (the first filler 230 and the second filler 232). The ability of the fillers to decrease the steps is also effective to decrease the steps formed between a variety of insulating films or the steps formed in the insulating films. In the present embodiment, a modified example is described in which the fillers are disposed to decrease the steps between the insulating films formed over the substrate 102.

Figure 10A:
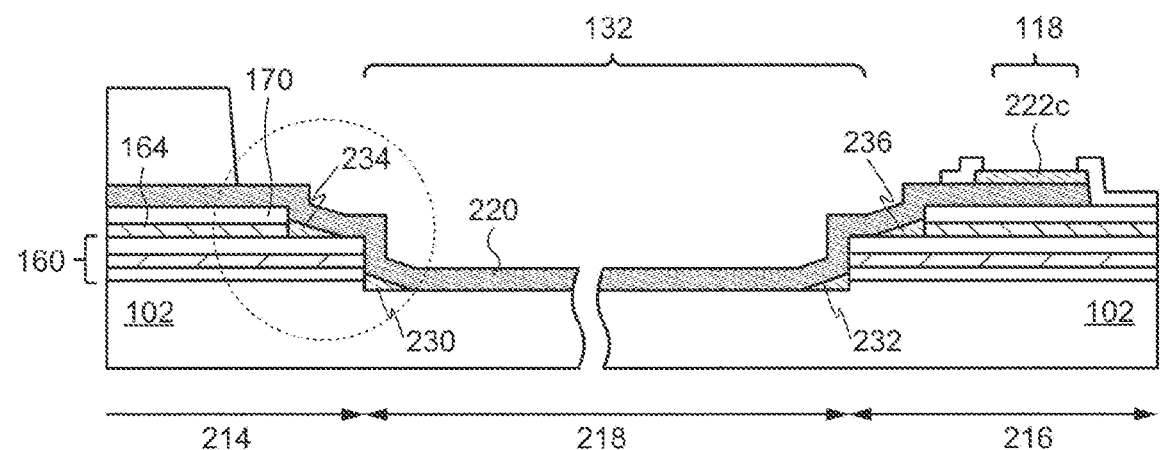
FIG. 10A is a schematic cross-sectional view of a display device according to an embodiment.
Figure 10B:
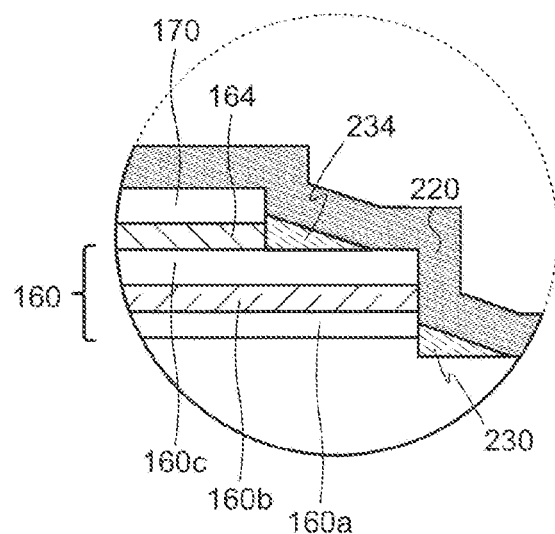
FIG. 10B is a schematic cross-sectional view of a display device according to an embodiment.

For example, the display device 100 may possess a third filler 234 and a fourth filler 236 in addition to or instead of the first filler 230 and the second filler 232 as shown in FIG. 10A and an enlarged view (FIG. 10B) of the region surrounded by the dotted circle. More specifically, the third filler 234 is in contact with the top surface of the undercoat 160, the side surfaces of the gate insulating film 164 and the interlayer insulating film 170, and the wiring 220 in the first region 214. In a similar way, the fourth filler 236 is in contact with the top surface of the undercoat 160, the side surfaces of the gate insulating film 164 and the interlayer insulating film 170, and the wiring 220 in the second region 216. In this case, the top surface of the undercoat 160 may be partly exposed from the third filler 234 and the fourth filler 236, or the whole of the top surface of the undercoat 160 may be covered by the third filler 234 and the fourth filler 236.

Figure 11A:
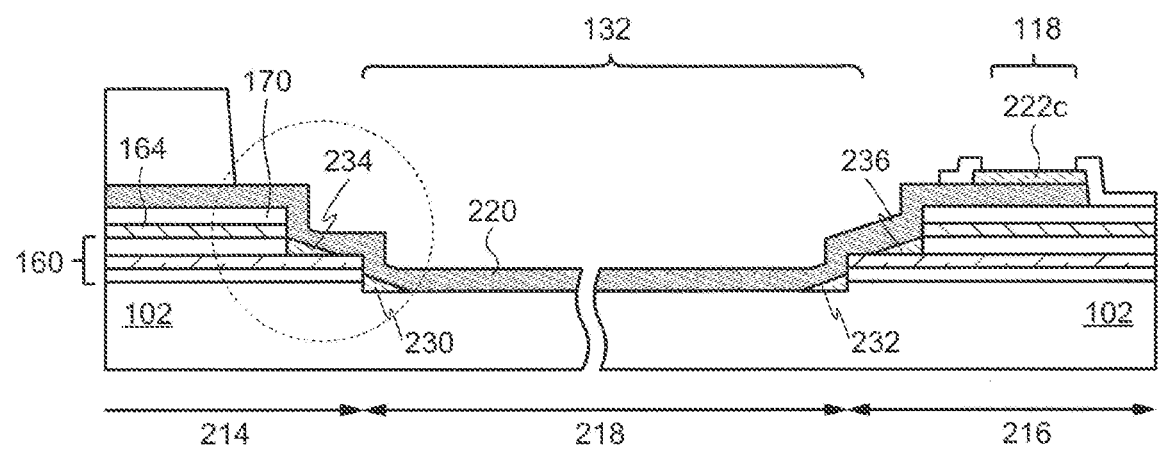
FIG. 11A is a schematic cross-sectional view of a display device according to an embodiment.
Figure 11B:
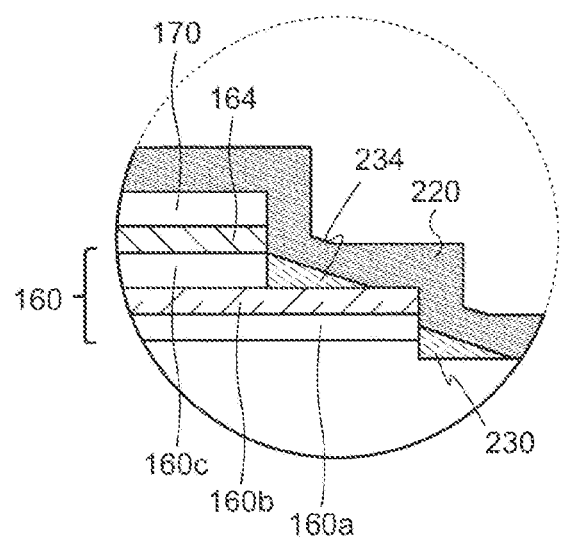
FIG. 11B is a schematic cross-sectional view of a display device according to an embodiment.

Alternatively, the undercoat 160 may have a first layer 160a, a second layer 160b, and a third layer 160c, and a side surface of the third layer 160c may overlap with the second layer 160b and the first layer 160a in the first region 214 and the second region 216 as shown in FIG. 11A and an enlarged view (FIG. 11B) of the region surrounded by the dotted circle. As shown in FIG. 11B, the side surface of the third layer 160c may be coplanar with the side surfaces of the gate insulating film 164 and the interlayer insulating film 170, or the side surfaces of the gate insulating film 164 and the interlayer insulating film 170 may overlap with a top surface of the third layer 160c. Such a structure tends to be readily formed when the second layer 160b and the third layer 160c include materials with a different etching rate. The third filler 234 is in contact with a top surface of the second layer 160b and the side surface of the third layer 160c in the first region 214 and in contact with the wiring 220. In a similar way, the fourth filler 236 is in contact with the top surface of the second layer 160b and the side surface of the third layer 160c in the second region 216 and in contact with the wiring 220.

Figure 12A:
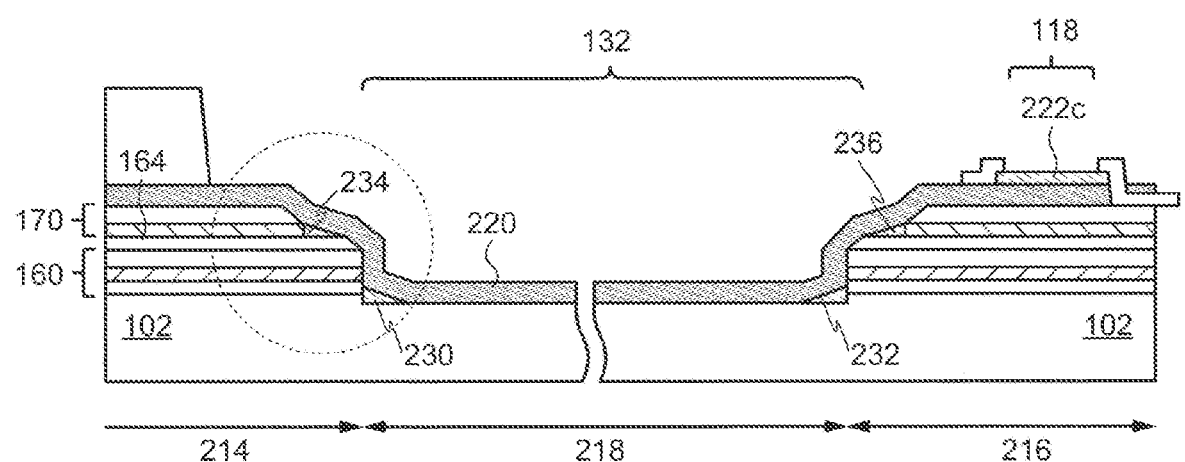
FIG. 12A is a schematic cross-sectional view of a display device according to an embodiment.
Figure 12B:
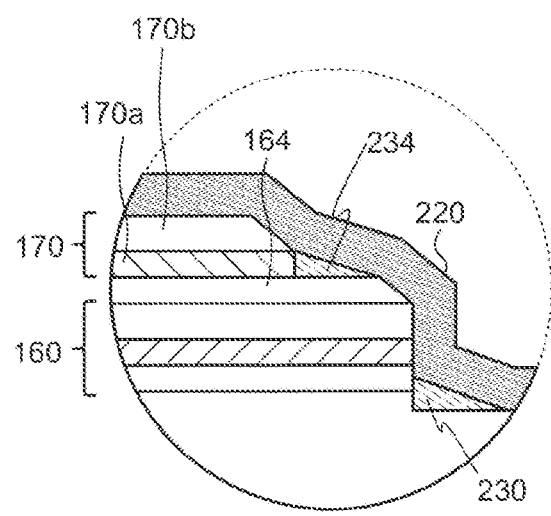
FIG. 12B is a schematic cross-sectional view of a display device according to an embodiment.

Alternatively, in a case where the stack of the insulating film 170 and the gate insulating film 164 forms a step, the third filler 234 and the fourth filler 236 may be provided so as to be in contact with a part of these insulating films as shown in FIG. 12A and an enlarged view (FIG. 12B) of the region surrounded by the dotted circle. For example, in a case where the interlayer insulating film 170 is a stacked film of a first layer 170a and a second layer 170b and a sidewall of the first layer 170a overlaps with a top surface of the gate insulating film 164, the third filler 234 and the fourth filler 236 may be formed so as to be in contact with the first layer 170a. Specifically, the third filler 234 is in contact with the top surface of the gate insulating film 164, the side surface of the first layer 170a, and the wiring 220 in the first region 214. In a similar way, the fourth filler 236 is in contact with the top surface of the gate insulating film 164, the side surface of the first layer 170a, and the wiring 220 in the second region 216. The gate insulating film 164 may be exposed from the first layer 170a, or the whole of the top surface which is not in contact with the first layer 170a may be covered by the third filler 234 and the fourth filler 236.

Figure 13A:
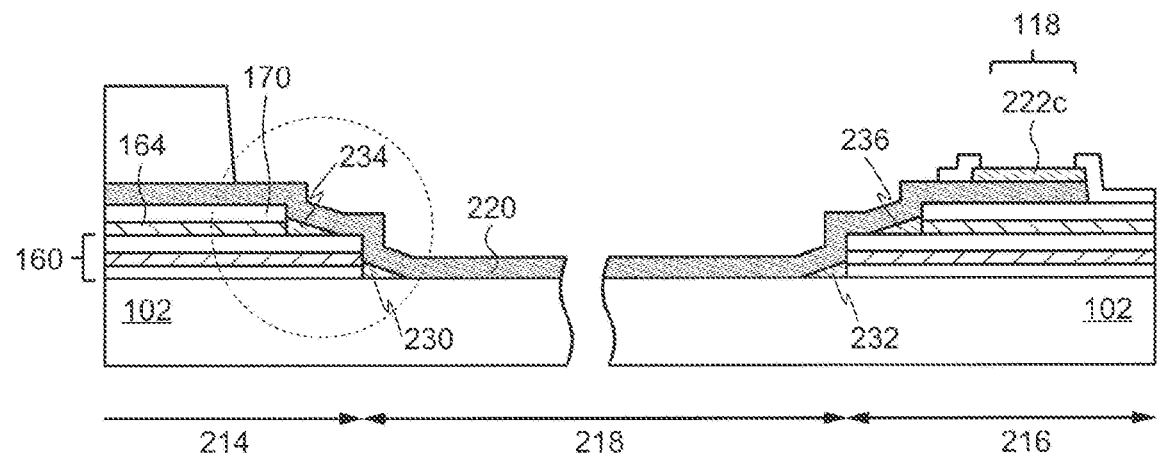
FIG. 13A is a schematic cross-sectional view of a display device according to an embodiment.
Figure 13B:
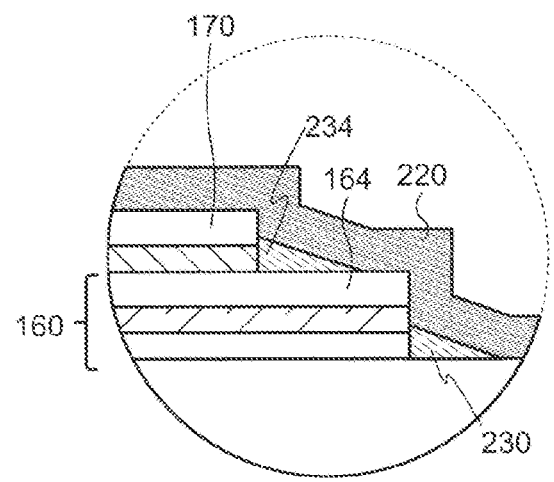
FIG. 13B is a schematic cross-sectional view of a display device according to an embodiment.

Note that, the trench 132 may not be formed in the substrate 102. For example, the top surface of the substrate 102 in the third region 218 may be coplanar with that in the first region 214 and the second region 216 as shown in FIG. 13A and an enlarged view (FIG. 13B) of a part of FIG. 13A. Namely, the thickness of the substrate 102 may be the same in the first region 214, the second region 216, and the third region 218.

Figure 14A:
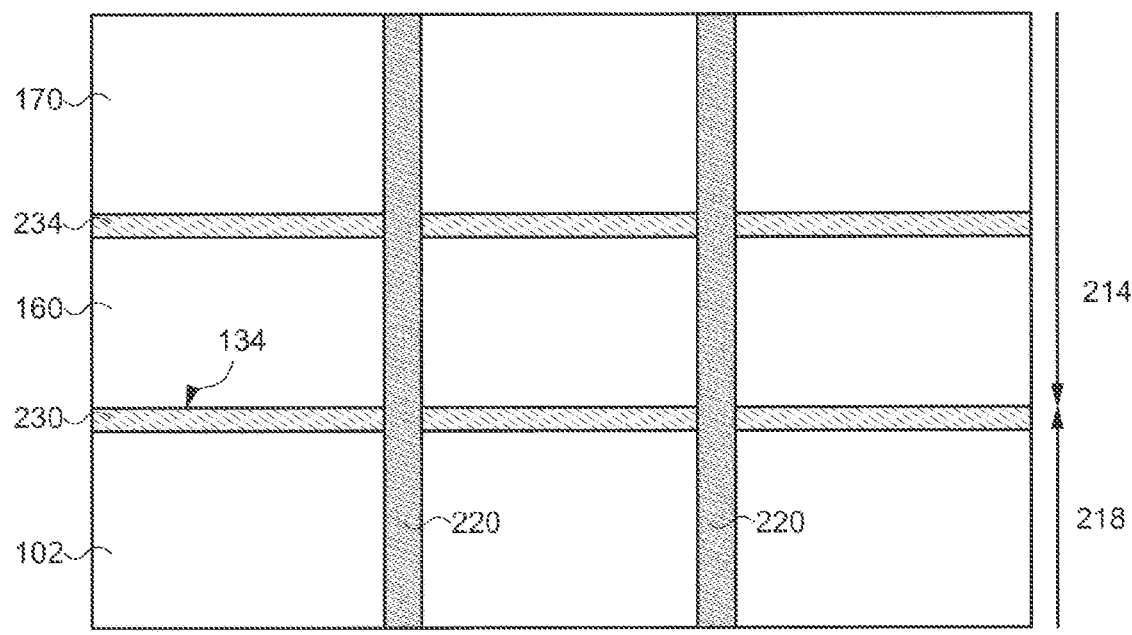
FIG. 14A is a schematic top view of a display device according to an embodiment.
Figure 14B:
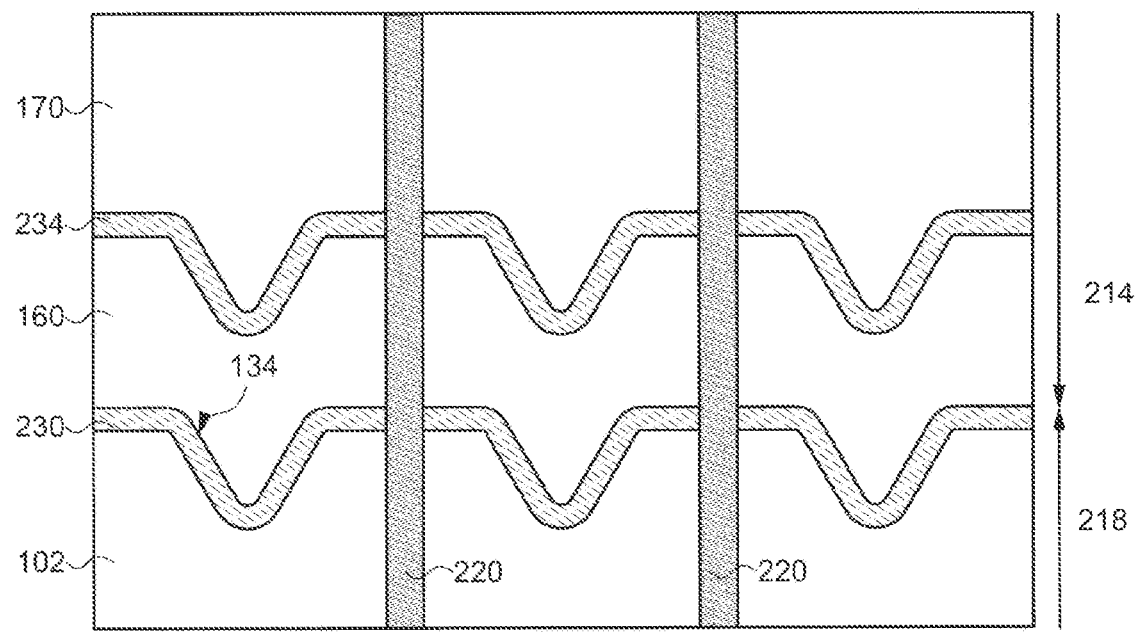
FIG. 14B is a schematic top view of a display device according to an embodiment.

Similar to the first filler 230 and the second filler 232, the third filler 234 and the fourth filler 236 are arranged parallel to the short side of the substrate 102 so as to extend along the interlayer insulating film 170 (or the gate insulating film 164) as shown in FIG. 14A. Although not illustrated, the third filler 234 and the fourth filler 236 may be arranged in an island form. Alternatively, the third filler 234 and the fourth filler 236 may be formed to have a curve in the plane parallel to the top surface of the substrate 102 as shown in FIG. 148. In the example demonstrated in FIG. 14B, the first sidewall 134, the side surface of the undercoat 160, and the side surface of the interlayer insulating film 170 have a curved shape between the adjacent wirings 220 in the plane parallel to the top surface of the substrate 102 and possess a straight shape in a region overlapping with the wiring 220. The first filler 230 and the third filler 234 also possess a curved shape in the plane parallel to the top surface of the substrate 102 so as to extend along the first wall 134, the side surface of the undercoat 160, and the side surface of the interlayer insulating film 170.

An explanation of other structures will be omitted because they are the same as or similar to those of the First Embodiment.

Similar to the First Embodiment, implementation of the present embodiment allows the steps to be decreased even though the steps are generated between the insulating films provided over the substrate 102 due to the difference in etching rate therebetween. As a result, it is possible to prevent disconnection of the wirings formed over the insulating films even if the display device 100 is deformed. Additionally, in a case where the overhang structure is formed between the insulating films, the step therebetween can be filled with the filler. Hence, a display device with high reliability can be produced.

Third Embodiment

In the present embodiment, a manufacturing method of the display device 100 is described. Here, a manufacturing method of the display device 100 having the structure shown in FIG. 9A is explained as an example by using FIG. 15A to FIG. 21. Each of FIG. 15A to FIG. 20B contains two drawings, and those on the left side are schematic cross-sectional views of the pixel 104, while those on the right side are schematic cross-sectional views in which the second region 216 is centered. An explanation of the contents which overlap with those in the First and Second Embodiments may be omitted.

Figure 15A:
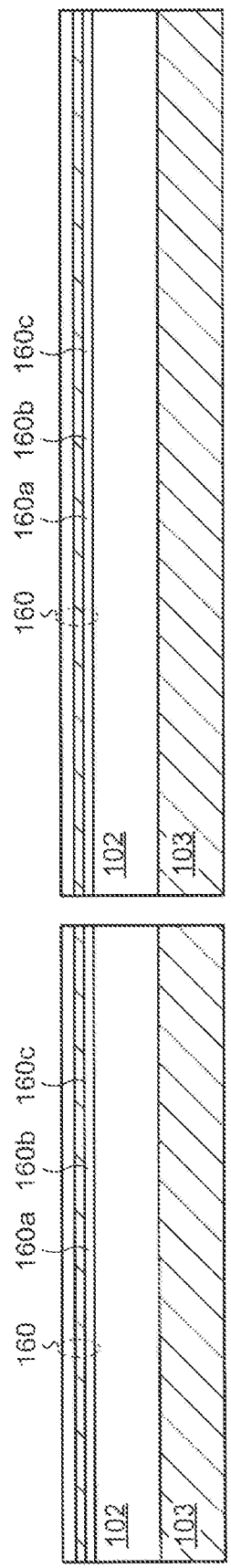
FIG. 15A is a schematic cross-sectional view for explaining a manufacturing method of a d splay device according to an embodiment.

As shown in FIG. 15A, the substrate 102 is first formed over a supporting substrate 103. The supporting substrate 103 supports a variety of insulating films, conductive films, and semiconductor films included in the display device 100 during the manufacturing process of the display device 100 and may contain glass or quartz. The substrate 102 is a flexible substrate and contains a polymer such as a polyimide, a polyamide, and a polycarbonate. The substrate 102 is formed over the supporting substrate 103 with a wet-type film-formation method such as an ink-jet method, a spin-coating method, and a printing method or a lamination method. When flexibility is not provided to the display device 100, the substrate 103 may be used instead of the substrate 102.

Next, the undercoat 160 is formed over the substrate 102 so as to have a single-layer structure or a stacked-layer structure. The undercoat 160 is provided over the whole of the surface of the substrate 102. Here, stacked layers of the first layer 160a to the third layer 160c are demonstrated as the undercoat 160, and a silicon-oxide film, a silicon-nitride film, and a silicon-oxide film may be respectively used for the first layer 160a to the third layer 160c, for example. In this case, the first layer 160a is formed to improve adhesion to the substrate 102, the second layer 160b is provided as a blocking film against impurities such as water, and the third layer 160c is provides as a blocking film to prevent diffusion of hydrogen atoms included in the second layer 160b. Although not illustrated, a light-shielding film may be formed in a region over which the transistors are to be formed before forming the undercoat 160. Here, a silicon-oxide film is a film containing silicon and oxygen as main components, while a silicon-nitride film is a film containing silicon and nitrogen as main components.

Figure 15B:
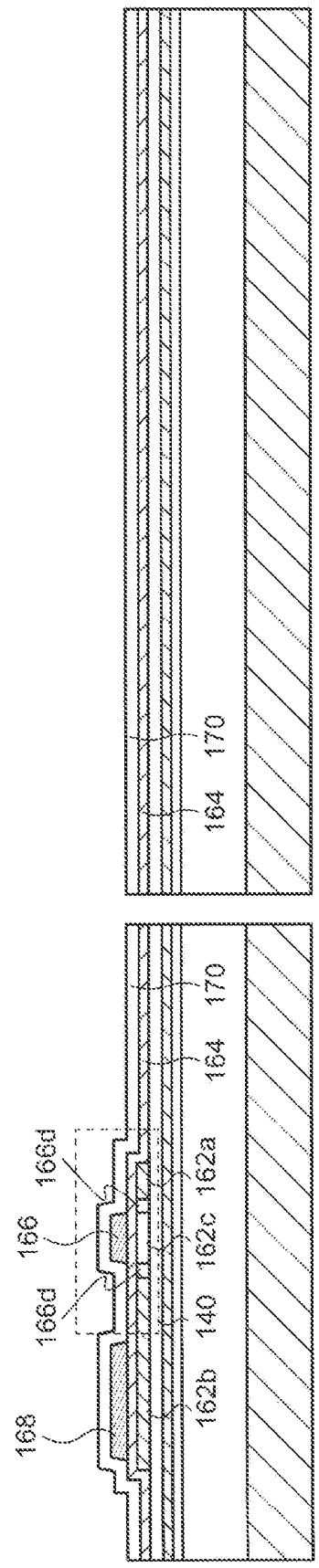
FIG. 15B is a schematic cross-sectional view for explaining a manufacturing method of a display device according to an embodiment.
Figure 16B:
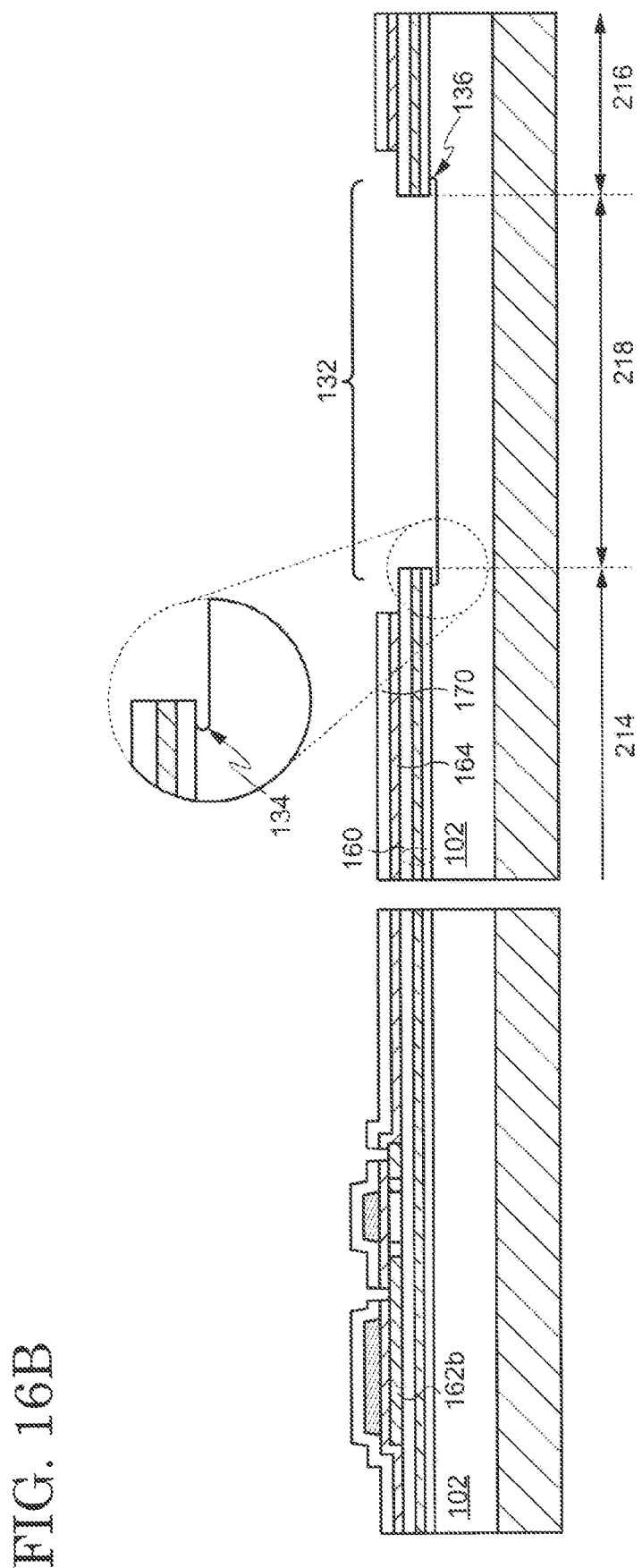
FIG. 16B is a schematic cross-sectional view for explaining a manufacturing method of a display device according to an embodiment.

Next, the transistors and the like in the pixel circuit are fabricated over the undercoat 160 (FIG. 15B). Here, although the formation of the n-channel type driving transistor 140 having polysilicon in the semiconductor film 162 as a transistor and the storage capacitor 150 is described as an example, a p-channel type transistor may be simultaneously formed. The semiconductor film 162, the gate insulating film 164, the gate electrode 166, and the capacitor electrode 168 are sequentially formed over the undercoat 160. The semiconductor film 162 has a structure in which not only a channel region 162c overlapping with the gate electrode 166, the drain region 162a, and the source region 162b but also low-concentration impurity regions 162d are arranged between the channel region 162c and the drain region 162a and between the channel region 162c and the source region 162b. The gate insulating film 164 includes a silicon-containing inorganic compound, and a silicon-oxide film or the like is employed. The gate electrode 166 and the capacitor electrode 168 are prepared by using a wiring (first wiring) including a metal selected from a variety of metals or an alloy thereof, and the first wiring possesses a stacked structure of molybdenum and tungsten, for example. The capacitor electrode 168 exists in the same layer as the gate electrode 166 and is used to fabricate the storage capacitor 150 as well as the gate insulating film 164 and the source region 162b.

The interlayer insulating film 170 is formed over the gate electrode 166 and the capacitor electrode 168 (FIG. 15B). The interlayer insulating film 170 is also prepared across the first region 214, the third region 218, and the second region 216. Although the interlayer insulating film 170 having a single-layer structure is illustrated in FIG. 15B, the interlayer insulating film 170 may be formed by stacking a silicon-nitride film and a silicon-oxide film.

After that, patterning is performed to partly remove the interlayer insulating film 170 and the gate insulating film 164, thereby exposing the undercoat 160 in the third region 218 (FIG. 16A). At that time, the openings for exposing the drain region 162a and the source region 162b are simultaneously formed.

Next, a region where the trench 132 is not formed is covered with a resist mask which is not illustrated, and the exposed undercoat 160 is removed with etching. At that time, it is preferred to perform over-etching to ensure removal of the undercoat 106 with etching in the third region 218. With this process, a part of the substrate 102 is removed, resulting in the trench 122 in the third region 218. Etching conditions may be appropriately selected. For example, conditions providing the overhang structure shown in FIG. 16B may be selected, or conditions allowing the undercoat 160 to be removed but inhibiting the formation of the trench 132 may be selected. Selection of the latter conditions provides the structure shown in FIG. 13A and FIG. 13B. Alternatively, the trench 132 may not be formed in the step of removing the undercoat 160 with etching but may be formed by removing a part of the substrate 102 in the step of removing the resist mask by sequential ashing.

Although not illustrated, the removal of the undercoat 160 and the formation of the trench 132 may be carried out simultaneously with the formation of the openings for exposing the dram region 162a and the source region 162b.

Figure 17A:
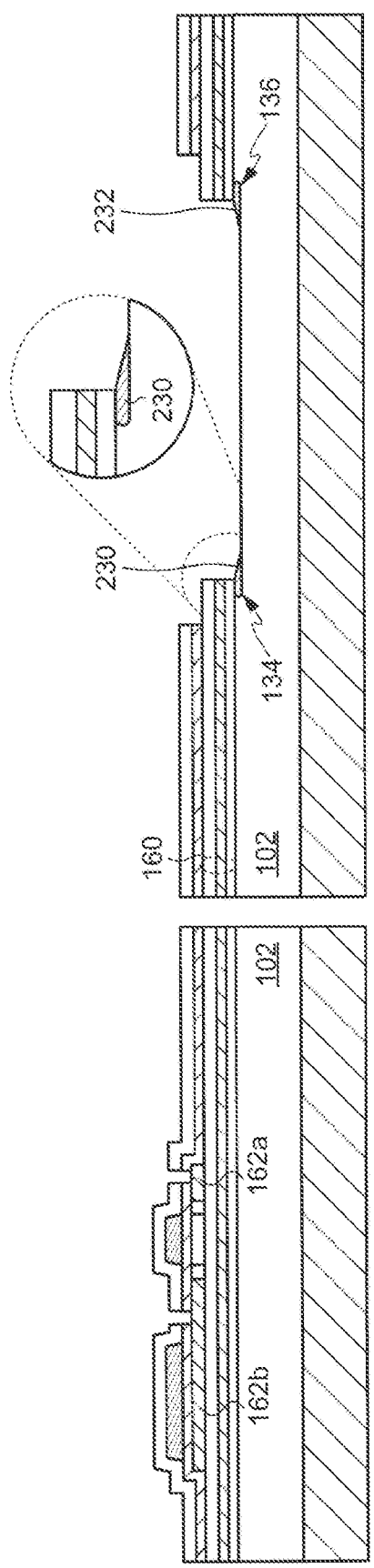
FIG. 17A is a schematic cross-sectional view for explaining a manufacturing method of a display device according to an embodiment.

Next, the first filler 230 and the second filler 232 are formed. Specifically, oligomers providing an acrylic resin or an epoxy resin is gasified under a reduced pressure or atomized, and the substrate 102 is exposed to the vapor of the oligomers (resin evaporation). At that time, the substrate 102 may be sprayed with the vapor of the oligomers using nitrogen or argon as a carrier gas. Due to the capillary phenomenon, the oligomers attached to the substrate 102 is preferentially disposed on the first sidewall 134 and the second sidewall 136, and the gap between the substrate 102 and the undercoat 160 formed at the vicinity of the first sidewall 134 and the second sidewall 136 are preferentially charged with the oligomers attached to the substrate 102. Therefore the oligomers can be locally and selectively formed on the first sidewall 134, the second sidewall 136, and in the gap formed at the vicinity thereof without using a mask by controlling the evaporation conditions (pressure and time of evaporation, heating temperature of the oligomers, and the like). After that, the oligomers are cured by a heating treatment or light irradiation to form the first filler 230 and the second filler 232, by which the overhang structure is covered by the first filler 230 and the second filler 232 (FIG. 17A). Note that, if necessary, the resin evaporation may be carried out while shielding the portion where the oligomers are not to be applied by using a shadow mask. Additionally, when the oligomers are attached to an unnecessary portion, the unnecessary oligomers and the resin derived from the oligomers may be removed with an ashing treatment in the presence of a gas including oxygen.

If the oligomers are applied in the openings formed over the drain region 162a and the source region 162b during the resin evaporation and the electrical connection with the dram electrode 172 and the source electrode 174 formed in the openings cannot be achieved, the first filler 230 and the second filler 232 may be formed using a shadow mask or may be formed after covering the openings with a resist mask.

Figure 17B:
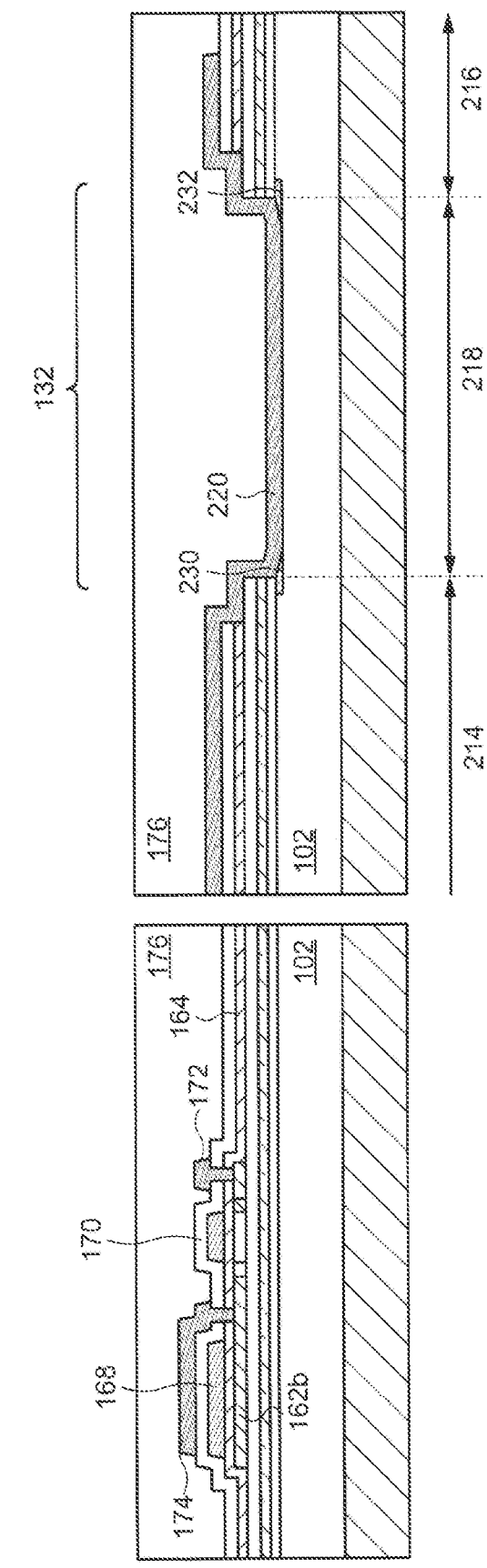
FIG. 17B is a schematic cross-sectional view for explaining a manufacturing method of a display device according to an embodiment.

Next, a conductive layer is formed using a second wiring and then etched to prepare the drain electrode 172, the source electrode 174, and the wiring 220 (FIG. 17B). The second wiring may be also formed as a stack of a plurality of metal layers, and a three-layer stacked structure of titanium/aluminum/titanium may be employed. With this process, the wiring 220 comes into contact with the substrate 102, the first filler 230, and the second filler 232 in the trench 132. At the same time, a part of the source electrode 174 is arranged to overlap with the capacitor electrode 168, by which the storage capacitor 150 is formed with the source region 162b, the gate insulating film 164, the capacitor electrode 168, the interlayer insulating film 170, and a part of the source electrode 174. The wiring 220 extends to the second region 216 and forms the power-source terminal 118 for connecting the FPC 114.

Figures 18A, 18B:
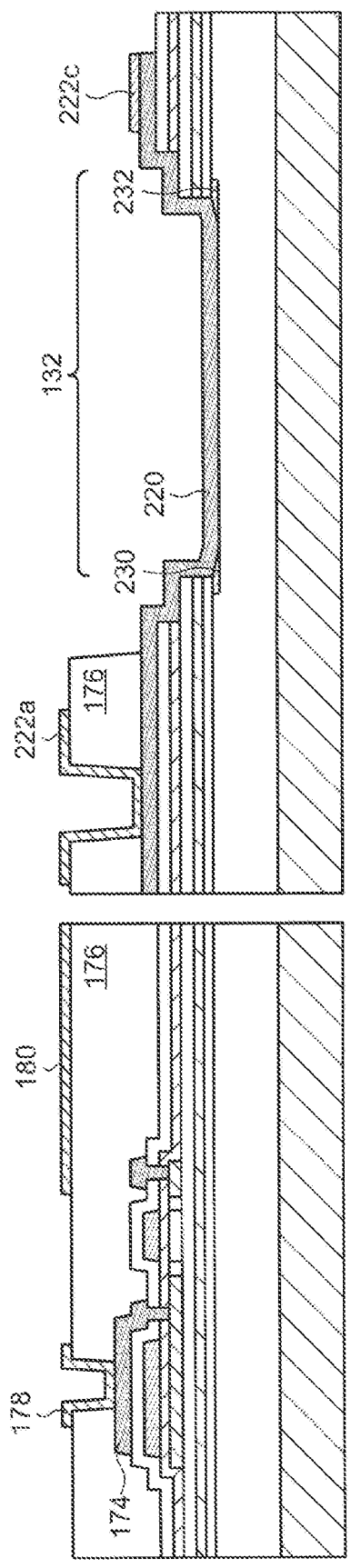
FIG. 18A is a schematic cross-sectional view for explaining a manufacturing method of a display device according to an embodiment.
FIG. 18B is a schematic cross-sectional view for explaining a manufacturing method of a display device according to an embodiment.

After that, the planarization film 176 is prepared so as to cover the driving transistor 140, the storage capacitor 150, and the wiring 220 (FIG. 17B). An organic material such as a photosensitive acrylic resin is used for the planarization film 176, thereby providing an insulating film with excellent planarity. The planarization film 176 is formed over almost all of the surface of the substrate 102 and then partly removed to form the openings used for the connection between the source electrode 174 and the pixel electrode 184, the connection between the wiring 220 and the contact electrode 222, the formation of the power-source terminal 118, and for providing high flexibility to the third region 218 (FIG. 18A). After that, the source electrode 174 and the wiring 220 exposed by removing the planarization film 176 are protected by using a conductive oxide such as indium-tin oxide (ITO) and indium-zinc oxide (IZO). That is, the connection electrode 178 connected to the source electrode 174 as well as the first contact electrode 222a and the protection electrode 222c connected to the wiring 220 are formed. The formation of these electrodes prevents the source electrode 174 and the wirings 220 from deteriorating in the following processes. Simultaneously, the supplementary capacitor electrode 180 is formed over the planarization film 176 (FIG. 18A).

Next, the capacitor insulating film 182 is formed to cover the connection electrode 178, the first contact electrode 222a, and the protection electrode 222c. The capacitor insulating film 182 may include a silicon-containing inorganic compound, and a silicon-nitride film is typically employed. The capacitor insulating film 182 is also formed by preparing an insulating film over almost all of the surface of the substrate 102, followed by performing patterning with etching to partly remove the insulating film so that the top surfaces of the connection electrode 178 and the first contact electrode 222a, a surface of the protection electrode 222c other than an edge portion thereof, and the wiring 220 are exposed (FIG. 18B). With this process, the terminals such as the power-source terminal 118 are fabricated. Simultaneously, the opening 188 is formed.

Next, the pixel electrode 184 is formed (FIG. 18B). The structure of the pixel electrode 184 is arbitrarily selected. For example, a three-layer stacked structure of IZO, silver, and IZO may be employed when the pixel electrode 184 is used as a reflective electrode. The pixel electrode 184 is formed so as to be electrically connected to the connection electrode 178 and overlap with the supplementary capacitor electrode 180. With this process, the pixel electrode 184 is electrically connected to the driving transistor 140, and the supplementary capacitor 152 is fabricated by the pixel electrode 184, the capacitor insulating film 182, and the supplementary capacitor electrode 180 in the pixel 184. Moreover, the second contact electrode 222b is simultaneously formed so as to overlap with and be electrically connected to the first contact electrode 222a when the pixel electrode 184 is formed.

Figure 19:
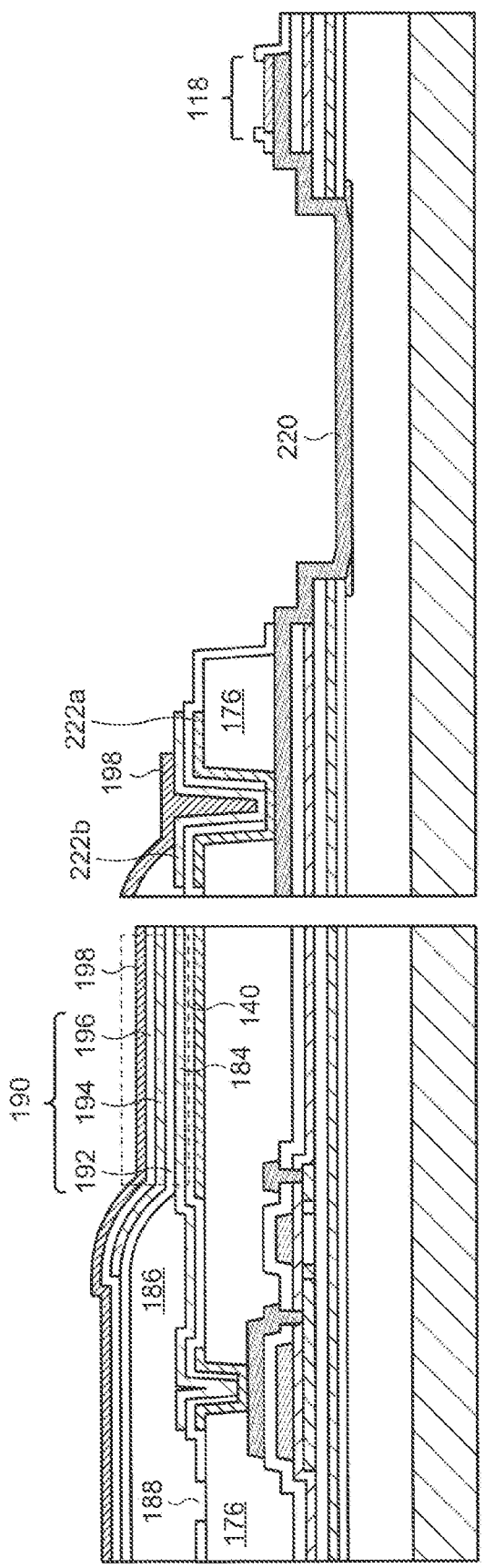
FIG. 19 is a schematic cross-sectional view for explaining a manufacturing method of a display device according to an embodiment.

After forming the pixel electrode 184, the partition wall (also called a bank or a rib) 186 is formed (FIG. 19). Similar to the planarization film 176, the partition wall 186 is formed using a photo-sensitive acrylic resin and the like. The partition wall 186 covers the edge portion of the pixel electrode 184 and possesses an opening exposing a surface of the pixel electrode 184 to allow the surface to function as an emission region. An edge of the opening preferably has a moderately tapered shape. If the edge of the opening is steeply tapered, a coverage deficiency of the EL layer 190 formed later is caused. Here, the planarization film 176 and the partition wall 186 are in contact with each other through the opening 188 formed in the capacitor insulating film 182 therebetween. This structure allows impurities such as water and an organic compound eliminated from the planarization film 176 through a heating treatment after the formation of the partition wall 186 to be released.

After forming the partition wall 186, the EL layer 190 is prepared (FIG. 19). The functional layers included in the EL layer 190 may be formed with an evaporation method or a wet-type film-formation method. After forming the EL layer 190, the opposing electrode 198 is formed. Here the opposing electrode 198 is configured to exhibit a light-transmitting property with respect to visible light since the light-emitting element 130 with a so-called top-emission structure is fabricated. For example, the opposing electrode 198 is formed by depositing an alloy of magnesium and silver at a thickness allowing the light emitted from the EL layer 190 to pass therethrough. The opposing electrode 198 is formed to cover not only the display region 106 but also the contact electrode 222 and is electrically connected to the wiring 220 via the first contact electrode 222a and the second contact electrode 222b. This structure allows the power-source potential (PVDD) provided from the power-source terminal 118 to be supplied to the opposing electrode 198.

Figure 20:
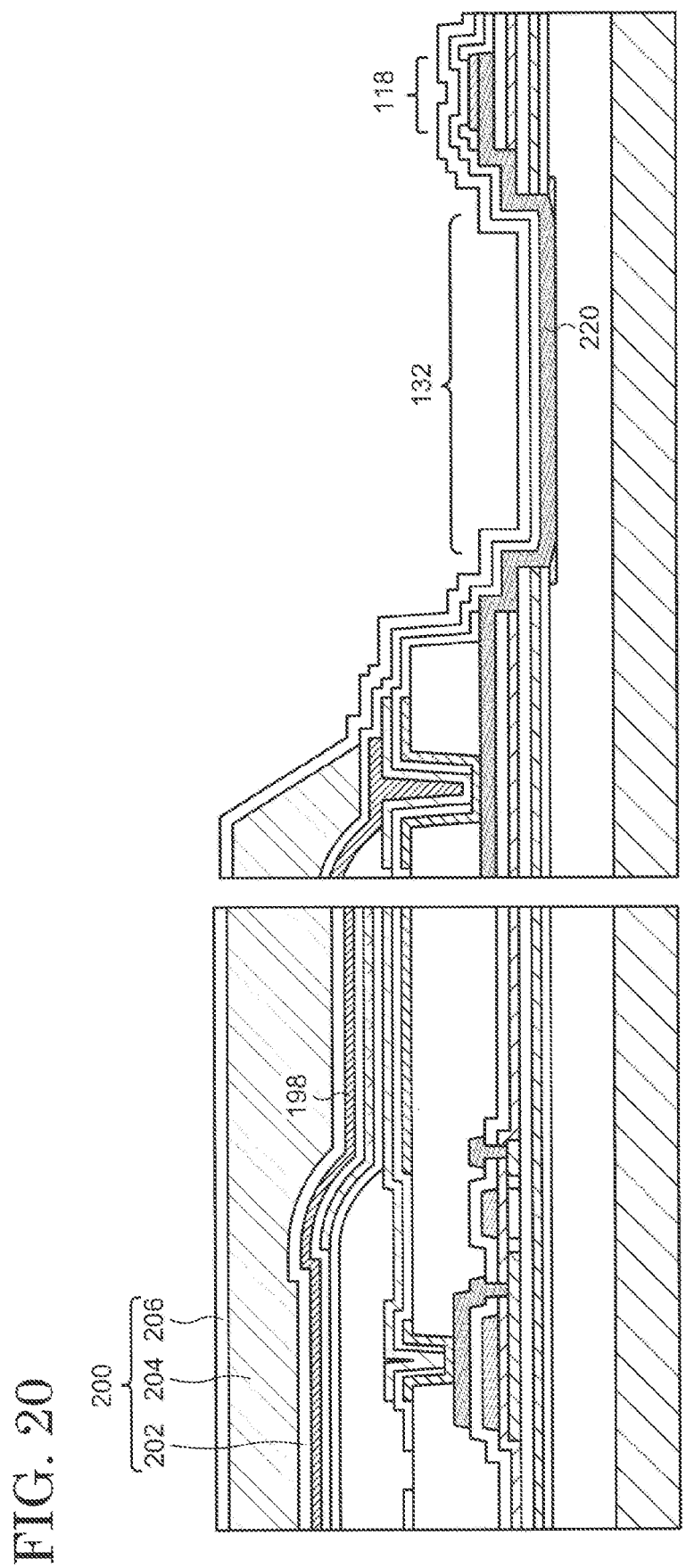
FIG. 20 is a schematic cross-sectional view for explaining a manufacturing method of a display device according to an embodiment.

After forming the opposing electrode 198, the passivation film 200 is prepared. The passivation film 200 has a function to prevent impurities such as water from entering the light-emitting element 130 from the outside. As shown in FIG. 20, the passivation film 200 may have a structure in which the first layer 202, the second layer 204, and the third layer 206 are stacked. These layers may be respectively formed as a silicon-nitride film, an organic resin film, and a silicon-nitride film. A silicon-oxide film or an amorphous silicon film may be further disposed between the first layer 202 and the second layer 204 or between the second layer 204 and the third layer 206 in order to improve adhesion.

Figure 21:
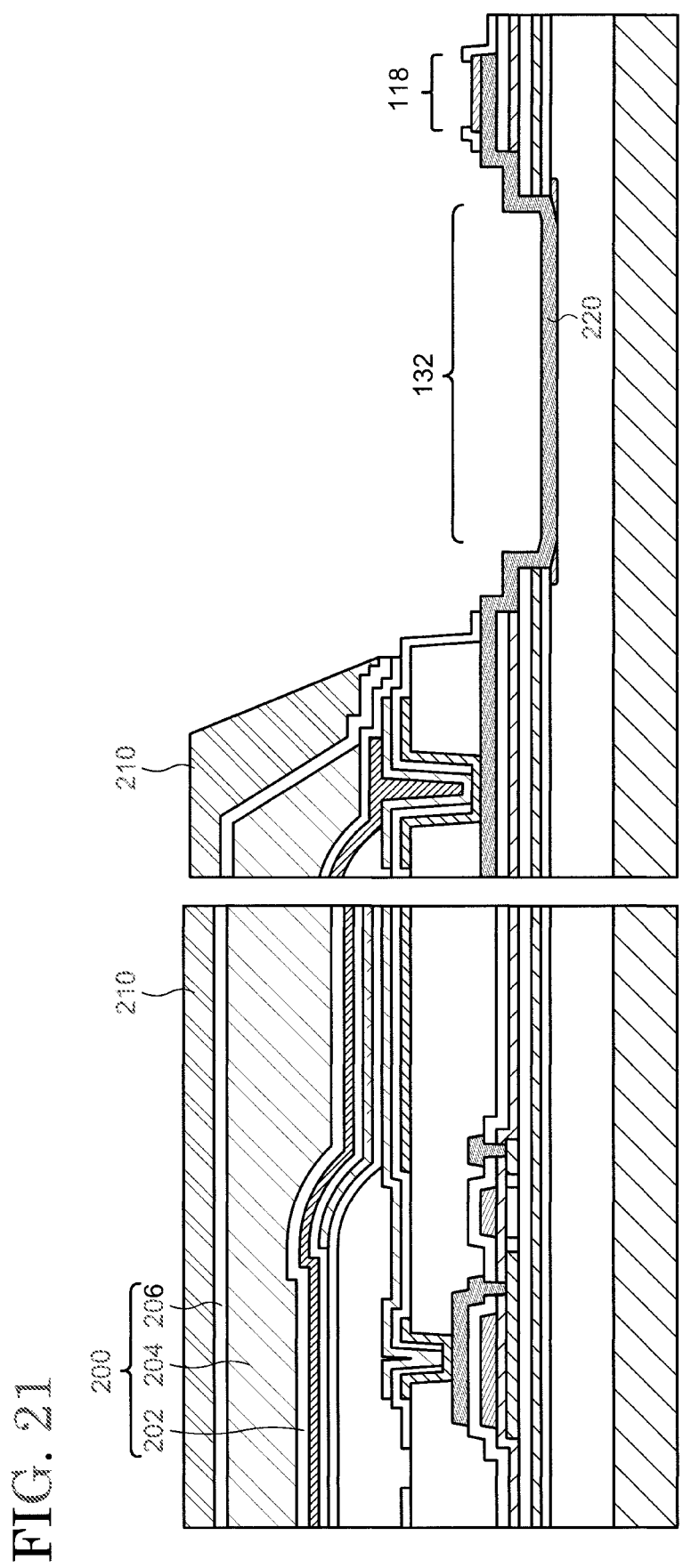
FIG. 21 is a schematic cross-sectional view for explaining a manufacturing method of a display device according to an embodiment.

At that time, the first layer 202 and the third layer 206 are formed so as to cover almost all of the surface of the substrate 102, while the second layer 204 is formed so as to cover the display region 106 and the contact electrode 222 but not to cover the trench 132 and the power-source terminal 118. After that, the resin film 210 is formed as shown in FIG. 21. The resin film 210 is prepared so as to selectively cover the display region 106 and contact electrode 222. Etching is conducted using this resin film 210 as a mask to remove the first layer 202 and the third layer 206 which are not covered by the resin film 210. With this process, the wiring 220 is exposed in the trench 132, and the protection film 222c of the power-source terminal 118 is exposed, enabling the electrical connection with the FPC 114.

Although not illustrated, a supporting film 128 is provided over the resin film 210, light irradiation is performed through the supporting substrate 103 to reduce adhesion between the supporting substrate 103 and the substrate 102, and the supporting substrate 103 is peeled off. A supporting film 126 is disposed after peeling off the supporting substrate 103, thereby providing the display device 100.

As described above, in the present embodiment, the first filler 230 and the second filler 232 can be selectively and locally provided on the side surfaces of the undercoat 160 and over the substrate 102 close to the side surfaces by treating the uncured resin oligomers under a reduced pressure and treating the substrate 102 with the obtained vapor of the oligomers. With this structure, the steps caused by the undercoat 160 can be decreased. In addition, even if the trench 132 is unintentionally formed, the first filler 230 and the second filler 232 can be selectively and locally provided on the sidewalls of the trench 132 and over the substrate close to the sidewalls, allowing the steps formed by the trench 132 and the undercoat 160 to be decreased. As a result, it is possible to prevent disconnection of the wirings for supplying the image signals and power source. Moreover, the insulating films such as the undercoat 160, the interlayer insulating film 170, and the planarization film 176 are not arranged in the region (third region 218) of the display device 100 which is to be bent, by which high flexibility can be provided to the third region 218. Additionally, no brittle insulating film is arranged in the third region 218 which is to be bent. Hence, reliability of the display device 100 caused by damage of these insulating films is not decreased. Accordingly, a display device with high reliability can be produced at a low cost.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A semiconductor device comprising:
   a substrate having a first region, a second region, and a trench overlapping with a region between the first region and second region and having a first sidewall and a second sidewall facing each other;
   a pair of first insulating films over and in contact with the substrate in the first region and the second region;
   a pair of second insulating films in the trench, the pair of second insulating films being spaced away from each other and respectively in contact with the first sidewall and the second sidewall; and
   a plurality of wirings over and in contact with the pair of first insulating films and the pair of second insulating films, the plurality of wirings being in contact with the substrate in the trench, wherein
   each of the pair of second insulating films is not in contact with an upper surface of the first insulating film, and
   the pair of first insulating films overlaps with the trench, and the pair of second insulating films is partly covered by the pair of first insulating films.

2. The semiconductor device according to claim 1, wherein
   one of the pair of second insulating films and the other of the pair of second insulating films are apart from each other.

3. The semiconductor device according to claim 1, wherein
   the plurality of wirings is in contact with a side surface and a top surface of each of the pair of first insulating films.

4. The semiconductor device according to claim 1, wherein
   surfaces of the pair of second insulating films in contact with the plurality of wirings are inclined from the first sidewall and the second sidewall in a cross-sectional view.

5. The semiconductor device according to claim 1, further comprising:
   a pair of third insulating films over the first region and the second region, respectively, and sandwiched by the pair of first insulating films and the plurality of wirings; and
   a pair of fourth insulating films over and in contact with the pair of first insulating films, respectively, the pair of fourth insulating films being in contact with the pair of third insulating films, respectively, wherein
   top surfaces of the pair of first insulating films are exposed from the pair of fourth insulating films, and
   the plurality of wirings is in contact with the pair of third insulating films and the pair of fourth insulating films.

6. The semiconductor device according to claim 5, wherein
   the pair of third insulating films includes an inorganic compound containing silicon, and
   the pair of fourth insulating films includes an organic compound containing carbon, oxygen, and hydrogen.

7. The semiconductor device according to claim 1, further comprising:
   a pair of third insulating films over the first region and the second region, respectively, and sandwiched by the pair of first insulating films and the plurality of wirings; and a pair of fourth insulating films in contact with surfaces of the pair of third insulating films, the pair of fourth insulating films being spaced away from the pair of first insulating films, wherein the plurality of wirings is in contact with the pair of third insulating films and the pair of fourth insulating films.

8. The semiconductor device according to claim 1, wherein the pair of third insulating films includes an inorganic compound containing silicon, and the pair of fourth insulating films includes an organic compound containing carbon, oxygen, and hydrogen.

9. The semiconductor device according to claim 1, wherein the pair of first insulating films includes an inorganic compound containing silicon, and the pair of second insulating films includes an organic compound containing carbon, oxygen, and hydrogen.

10. The semiconductor device according to claim 1, further comprising a bent portion overlapping with the trench in a plan view.

* * * * *